(12) United States Patent
Shimizu

(10) Patent No.: US 11,538,936 B2
(45) Date of Patent: Dec. 27, 2022

(54) SEMICONDUCTOR DEVICE

(71) Applicant: ROHM CO., LTD., Kyoto (JP)

(72) Inventor: Yusuke Shimizu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 40 days.

(21) Appl. No.: 17/188,315

(22) Filed: Mar. 1, 2021

(65) Prior Publication Data

US 2021/0280713 A1    Sep. 9, 2021

(30) Foreign Application Priority Data

Mar. 4, 2020    (JP) .............................. JP2020-037072

(51) Int. Cl.
| | | |
|---|---|---|
| H01L 21/76 | (2006.01) | |
| H01L 29/08 | (2006.01) | |
| H01L 29/10 | (2006.01) | |
| H01L 29/78 | (2006.01) | |

(52) U.S. Cl.
CPC ...... *H01L 29/7816* (2013.01); *H01L 29/0865* (2013.01); *H01L 29/0882* (2013.01); *H01L 29/1095* (2013.01)

(58) Field of Classification Search
CPC ....... H01L 21/76; H01L 21/761; H01L 29/08; H01L 29/0865; H01L 29/0882; H01L 29/10; H01L 29/1095; H01L 29/78; H01L 29/7816

USPC ......................................................... 257/343

See application file for complete search history.

(56) References Cited

U.S. PATENT DOCUMENTS

2008/0283914 A1* 11/2008 Fujii ................. H01L 29/66712
                                                                   257/341

FOREIGN PATENT DOCUMENTS

JP            2012-156205 A      8/2012

* cited by examiner

*Primary Examiner* — Fazli Erdem
(74) *Attorney, Agent, or Firm* — Rabin & Berdo, P.C.

(57) ABSTRACT

A semiconductor device includes: an n⁻-type epitaxial layer having an element main surface; a p⁻-type body region, an n⁺-type source region, and n⁺-type drain regions; and a gate electrode including a second opening and first openings formed in a portion separated from the second opening toward the drain regions, wherein the body region selectively has a second portion exposed to the first openings of the gate electrode, and wherein the semiconductor device further includes a p⁺-type body contact region formed in the portion of the body region exposed to the first openings and having an impurity concentration higher than an impurity concentration of the body region.

15 Claims, 23 Drawing Sheets

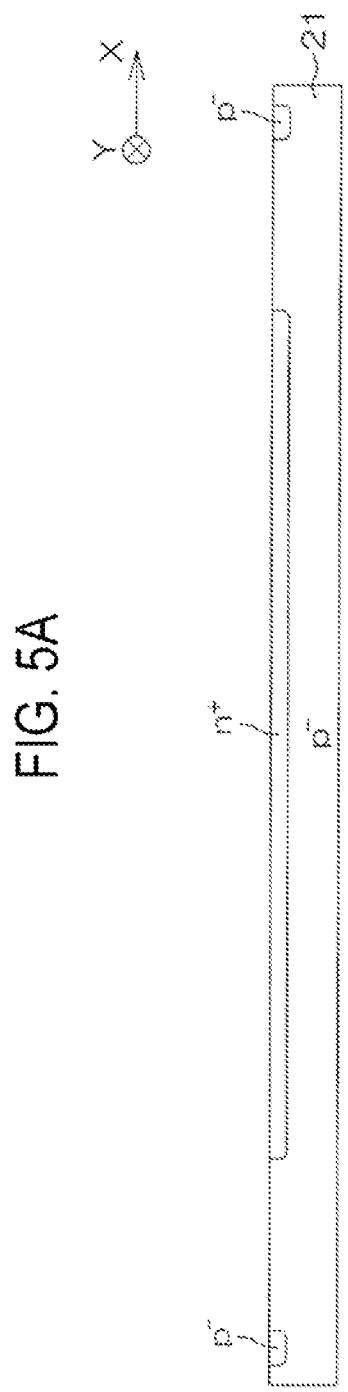

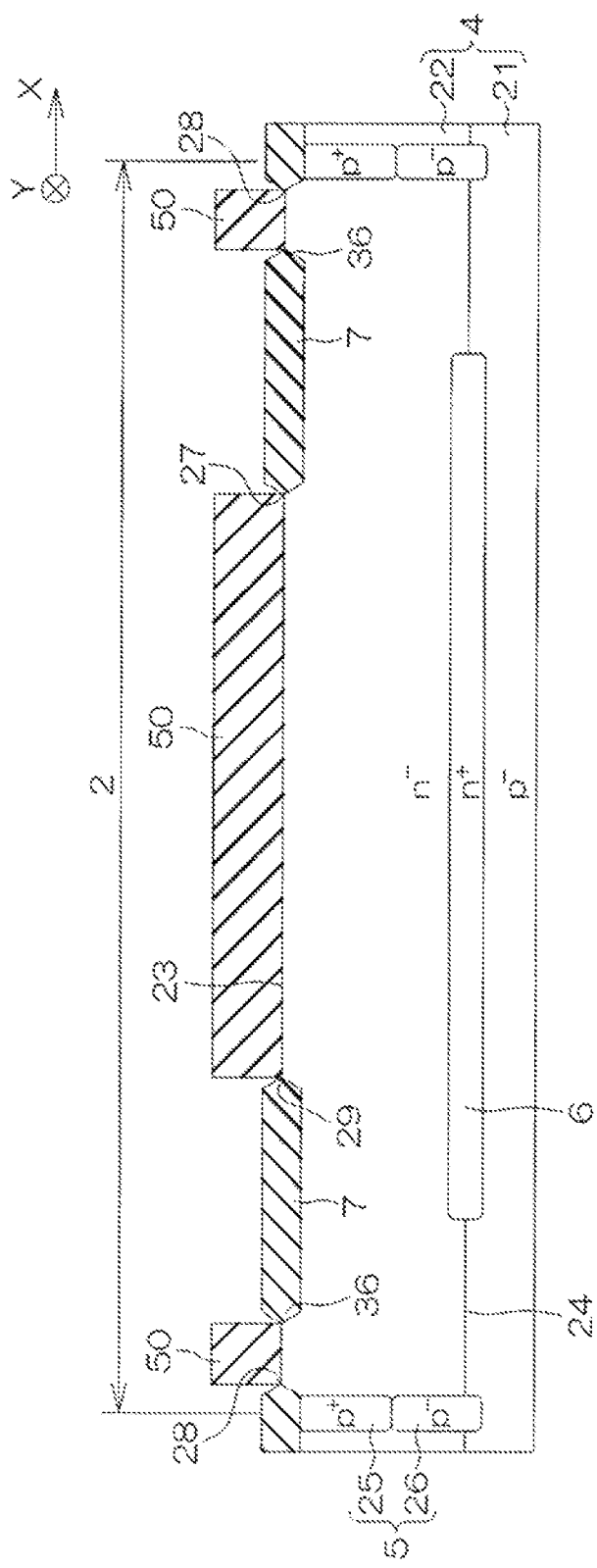

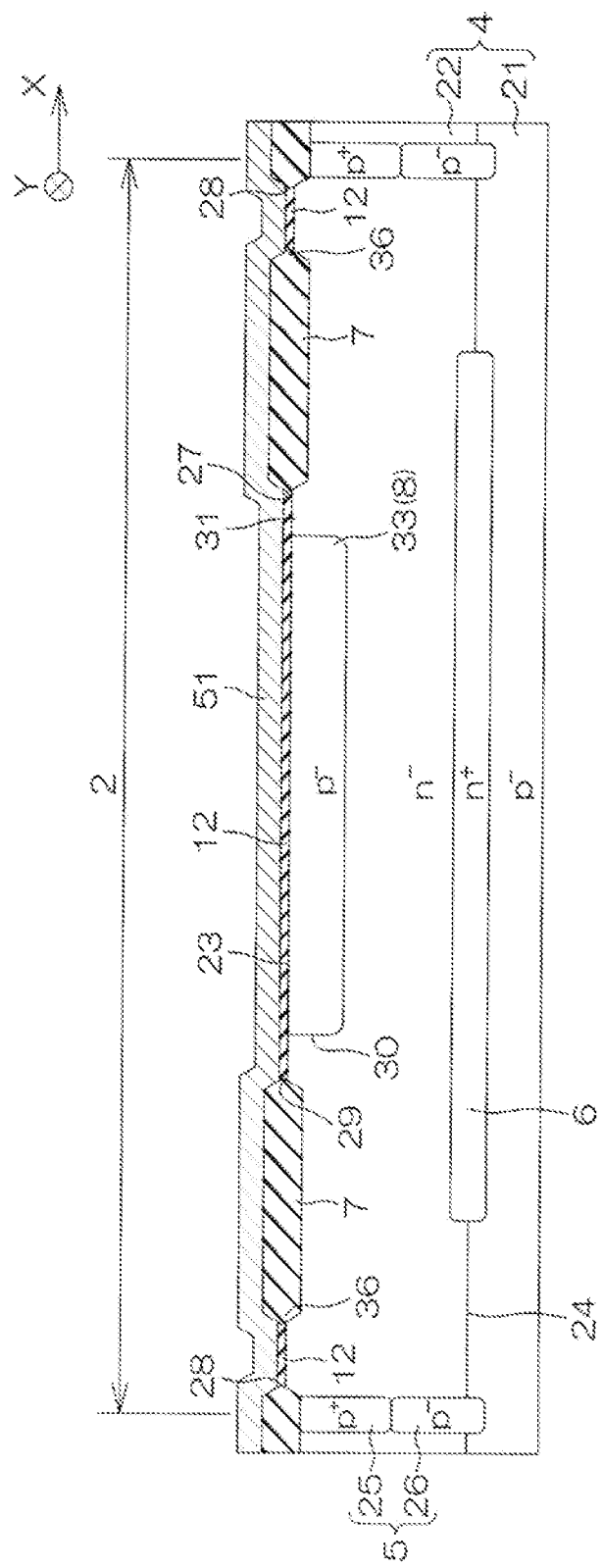

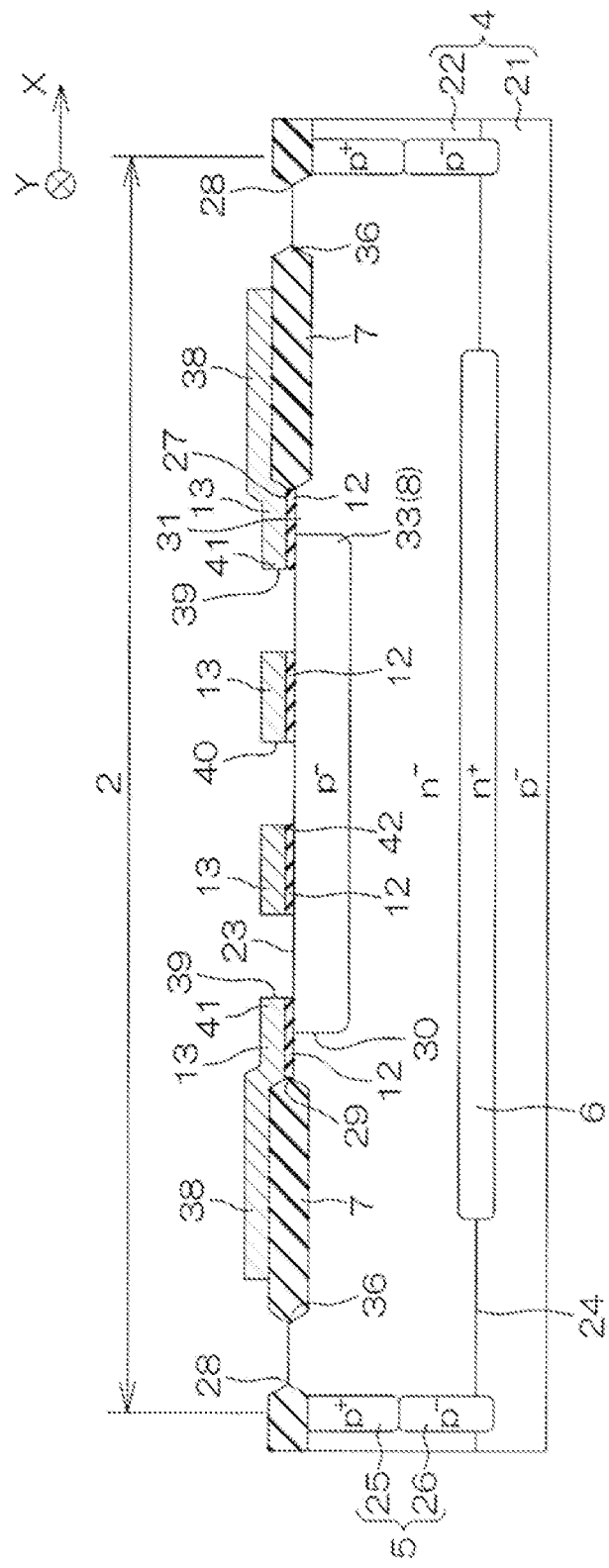

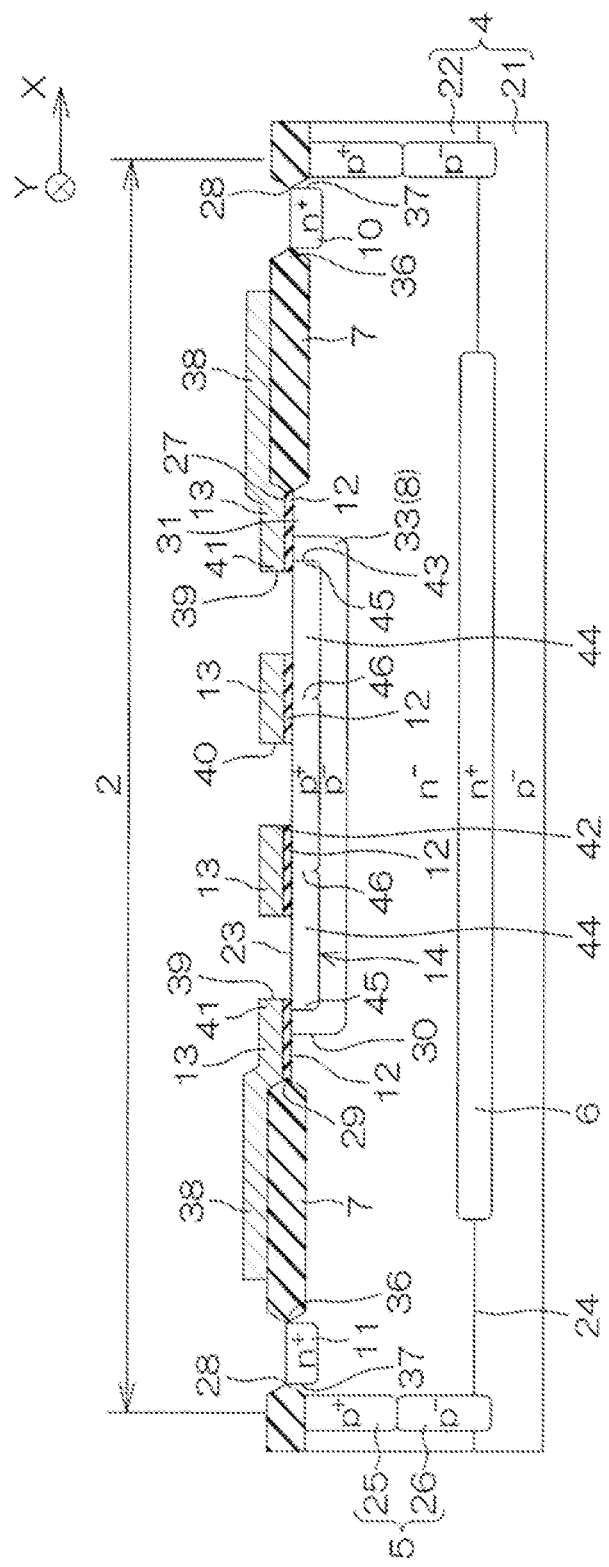

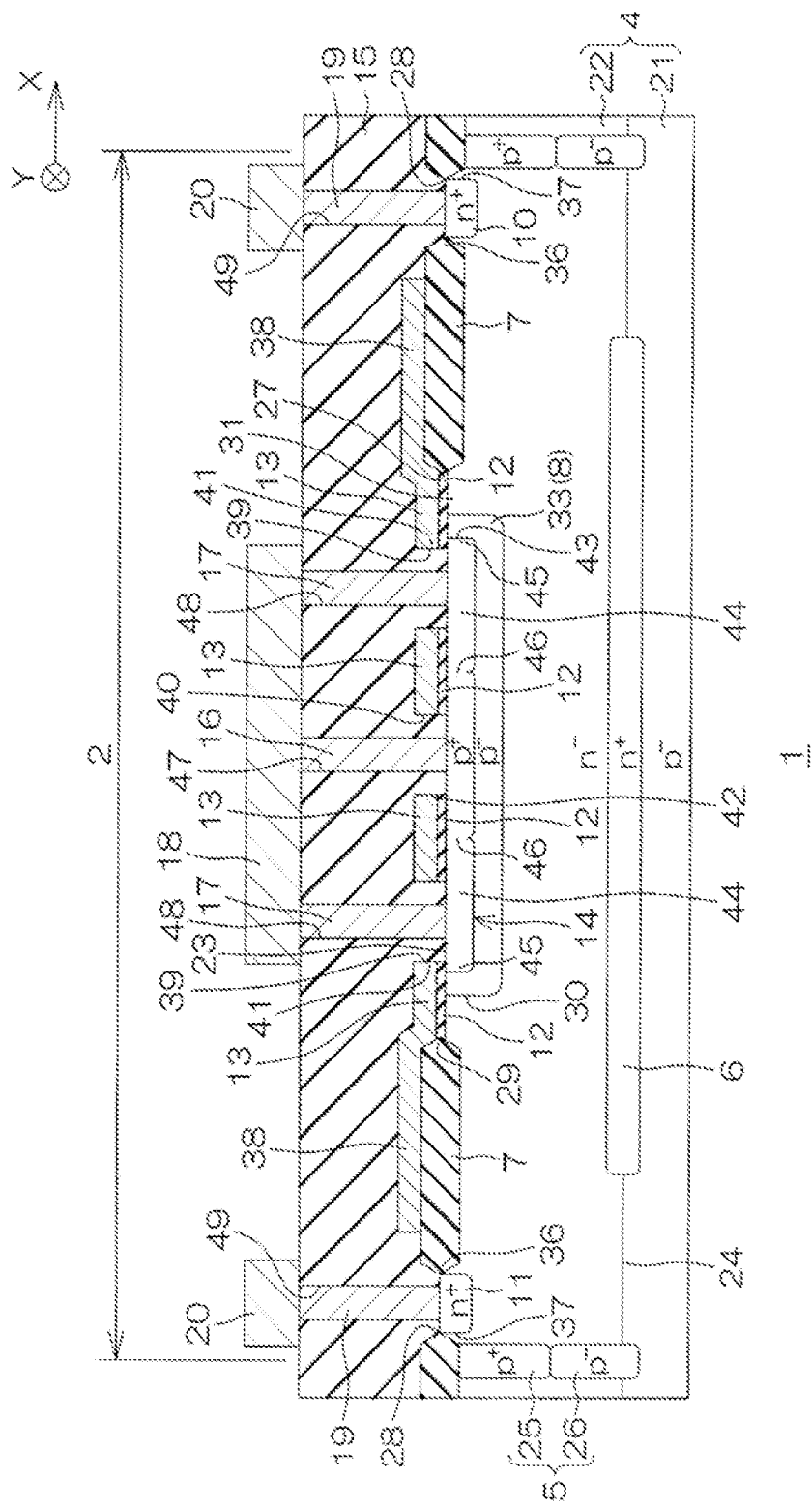

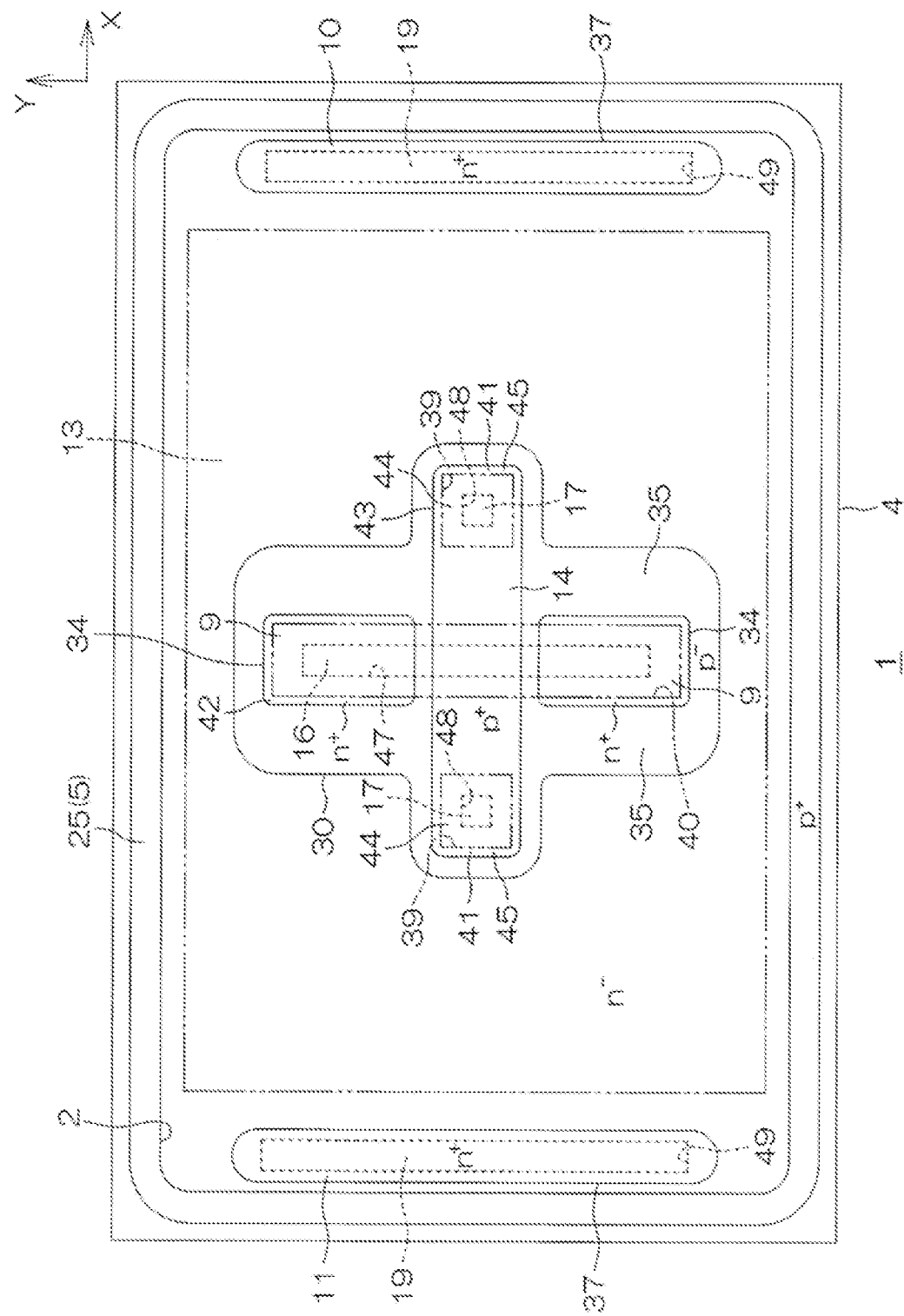

SEMICONDUCTOR DEVICE

CROSS-REFERENCE TO RELATED APPLICATION

This application is based upon and claims the benefit of priority from Japanese Patent Application No. 2020-037072, filed on Mar. 4, 2020, the entire contents of which are incorporated herein by reference.

TECHNICAL FIELD

The present disclosure relates to a semiconductor device.

BACKGROUND

A known semiconductor device includes a p-type well region that isolates element forming regions from one another, and DMOS transistors formed in the element forming regions. The semiconductor device includes a p-type silicon substrate, n-type source and drain regions selectively formed on a surface of the silicon substrate and isolated from each other by a field oxide film, and a gate electrode formed on the silicon substrate via a gate oxide film. The field oxide film is formed on the p-type well region.

SUMMARY

A semiconductor device according to an embodiment of the present disclosure includes: a first conductive type semiconductor layer having an element main surface; a second conductive type body region formed on the element main surface of the semiconductor layer; a first conductive type source region formed in the body region and separated inward from an outer edge of the body region; at least one first conductive type drain region formed on the element main surface of the semiconductor layer and separated from the body region in a first direction; and a gate electrode facing a channel region between the source region and the outer edge of the body region, the gate electrode including a first edge portion adjacent to the source region, and at least one first opening formed in a portion separated from the first edge portion toward the at least one drain region or at least one concave portion in which the first edge portion is selectively formed to be recessed toward the at least one drain region, wherein the body region selectively has a portion exposed to the at least one first opening or the at least one concave portion of the gate electrode, and wherein the semiconductor device further includes a second conductive type body contact region formed in the portion of the body region exposed to the at least one first opening or the at least one concave portion and having an impurity concentration higher than an impurity concentration of the body region.

BRIEF DESCRIPTION OF DRAWINGS

FIG. 2 is a schematic plan view of the semiconductor device in which portions surrounded by two-dot chain line II in FIG. 1 is seen-through.

FIG. 5A is a view showing a process of manufacturing the semiconductor device.

FIG. 5C is a view showing a next process of FIG. 5B.
FIG. 5E is a view showing a next process of FIG. 5D.
FIG. 5F is a view showing a next process of FIG. 5E.
FIG. 5G is a view showing a next process of FIG. 5F.
FIG. 5H is a view showing a next process of FIG. 5G.
FIG. 16 is a view showing a modification of the semiconductor device.

DETAILED DESCRIPTION

Embodiments of Present Disclosure

Figure 1:
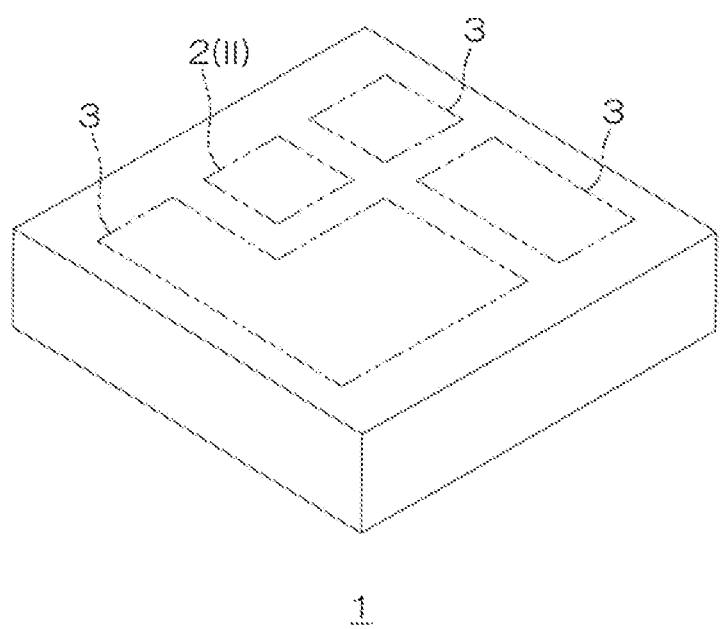
FIG. 1 is a schematic perspective view of a semiconductor device according to a first embodiment of the present disclosure.

First, embodiments of the present disclosure will be listed and described.

A semiconductor device according to an embodiment of the present disclosure includes: a first conductive type semiconductor layer having an element main surface; a second conductive type body region formed on the element main surface of the semiconductor layer; a first conductive type source region formed in the body region and separated inward from an outer edge of the body region; at least one first conductive type drain region formed on the element main surface of the semiconductor layer and separated from the body region in a first direction; and a gate electrode facing a channel region between the source region and the outer edge of the body region, the gate electrode including a first edge portion adjacent to the source region, and at least one first opening formed in a portion separated from the first edge portion toward the at least one drain region or at least one concave portion in which the first edge portion is selectively formed to be recessed toward the at least one drain region, wherein the body region selectively has a portion exposed to the at least one first opening or the at least one concave portion of the gate electrode, and wherein the semiconductor device further includes a second conductive type body contact region formed in the portion of the body region exposed to the at least one first opening or the at least one concave portion and having an impurity concentration higher than an impurity concentration of the body region The semiconductor device described above may include a parasitic bipolar transistor formed by the source region, the body region, and the drain region, which are arranged in the first direction along the element main surface of the semiconductor layer. For example, when the first conductive type is an n-type and the second conductive type is a p-type, an npn bipolar transistor is formed. On the other hand, when the first conductive type is a p-type and the second conductive type is an n-type, a pnp bipolar transistor is formed.

Such a type of parasitic bipolar transistor may be turned on when an overvoltage is applied between the source and the drain due to, for example, ESD (Electro-Static Discharge). As a result, a large local current is generated in a MISFET including the source region, the body region, and the drain region, which may lead to destruction of the MISFET. As measures against ESD, it is desirable to prepare an environment in which it is difficult for the parasitic bipolar transistor to be turned on.

For example, an npn bipolar transistor is turned on by applying a forward bias between the base and the emitter of the npn bipolar transistor. Therefore, it is desirable to prevent the npn bipolar transistor from being turned on by suppressing the potential rise in the base region (the body region in the present embodiment) to suppress the application of the forward bias.

Therefore, in the semiconductor device described above, the first opening or the concave portion is formed in the gate electrode, and the body contact region is formed in the first opening or the concave portion. Thus, in the first direction, the potential of the body region can be provided from the body contact region at locations close to the drain region with respect to the source region. Therefore, in the first direction, the potential rise of the body region from the source region toward the drain region can be suppressed. As a result, it is possible to suppress the turn-on of the parasitic bipolar transistor.

Therefore, it is possible to provide the semiconductor device having improved ESD resistance, and when necessary, it is possible to reduce the number of ESD protection elements. With the reduction of the number of ESD protection elements, a chip area can be reduced, which can lead to reduction in costs. Further, since the ESD design becomes unnecessary, the design of the semiconductor device can be simplified.

In the semiconductor device according to the embodiment of the present disclosure, the body region may include a first portion having a first width, and a second portion having a second width larger than the first width, the second portion selectively protruding from the first portion in the first direction and being exposed to the at least one first opening or the at least one concave portion of the gate electrode. The body contact region may be formed in the second portion of the body region.

In the semiconductor device according to the embodiment of the present disclosure, the body contact region may extend toward the first edge portion of the gate electrode, and the source region may be divided by the body contact area in a second direction intersecting the first direction In the semiconductor device according to the embodiment of the present disclosure, the first edge portion of the gate electrode may include an edge portion of a second opening that exposes the source region and the body contact region in common.

In the semiconductor device according to the embodiment of the present disclosure, the first edge portion of the gate electrode may include an edge portion of a second opening that exposes the source region, the at least one drain region may include a first drain region and a second drain region facing each other with the source region interposed between the first drain region and the second drain region in the first direction, and the at least one first opening of the gate electrode may include two first openings that are formed on a side of the first drain region and a side of the second drain region, respectively, with respect to the source region.

In the semiconductor device according to the embodiment of the present disclosure, the body contact region may be formed in a line shape from the at least one first opening on the side of the first drain region to the at least one first opening on the side of the second drain region, and the source region may be divided by the body contact region in a second direction intersecting the first direction.

In the semiconductor device according to the embodiment of the present disclosure, the body contact region may have a portion, which is selectively shallow in depth from the element main surface, between the at least one first opening and the second opening.

In the semiconductor device according to the embodiment of the present disclosure, a width of the at least one first opening may be 0.4 μm to 1.0 μm.

In the semiconductor device according to the embodiment of the present disclosure, the at least one first opening may be separated from the second opening by 0.4 μm to 1.0 μm.

In the semiconductor device according to the embodiment of the present disclosure, the at least one drain region may include a first drain region and a second drain region facing each other with the source region interposed between the first drain region and the second drain region in the first direction, and the at least one concave portion of the gate electrode may include two concave portions that are formed toward a side of the first drain region and a side of the second drain region, respectively.

In the semiconductor device according to the embodiment of the present disclosure, the body contact region may be formed in a line shape from the at least one concave portion on the side of the first drain region toward the at least one concave portion on the side of the second drain region, and the source region may be divided by the body contact region in a second direction intersecting the first direction.

In the semiconductor device according to the embodiment of the present disclosure, a depression amount of the at least one concave portion may be 0.4 μm to 1.0 μm.

The semiconductor device according to the embodiment of the present disclosure may further include: an insulating layer formed on the semiconductor layer; a source contact that penetrates the insulating layer and is connected to the source region; at least one body contact that penetrates the insulating layer and is connected to the body contact region via the at least one first opening or the at least one concave portion; and a source wiring formed on the insulating layer and connected in common to the source contact and the at least one body contact.

In the semiconductor device according to the embodiment of the present disclosure, the impurity concentration of the body region may be $1\times10^{17}$ cm$^{-3}$ to $1\times10^{18}$ cm$^{-3}$, and the impurity concentration of the body contact region may be $1\times10^{19}$ cm$^{-3}$ to $1\times10^{20}$ cm$^{-3}$.

In the semiconductor device according to the embodiment of the present disclosure, when the semiconductor layer includes a first element region including the body region, the source region, and the at least one drain region, and a second element region formed independently of the first element region, the semiconductor device may further include an integrated circuit device in which the first element region and the second element region are integrated in the common semiconductor layer.

Detailed Description of Embodiments of Present Disclosure

Next, embodiments of the present disclosure will be described in detail with reference to the accompanying drawings.

First Embodiment (Configuration of Semiconductor Device 1)

FIG. 1 is a schematic perspective view of a semiconductor device 1 according to a first embodiment of the present disclosure.

The semiconductor device 1 includes, for example, a chip-shaped integrated circuit (IC) device. The semiconductor device 1 may be called SSI (Small Scale IC), MSI (Middle Scale IC), LSI (Large Scale IC), VLSI (Very Large Scale IC), or ULSI (Ultra Large Scale IC) based on the number of integrated circuit elements.

The semiconductor device 1 has a plurality of element regions 2 and 3 in which circuit elements are formed. The plurality of element regions 2 and 3 is formed on a common semiconductor substrate 4 to be described later.

The plurality of element regions 2 and 3 includes a first element region 2 and a plurality of second element regions 3. The first element region 2 may be an element region in which LDMOS (Lateral Double-diffused MOS) is formed as a circuit element. The plurality of second element regions 3 may be regions in which other functional elements (for example, protection diodes for LDMOS, resistors, capacitors, and the like) are formed. Although four element regions 2 and 3 are shown in FIG. 1, the semiconductor device 1 may have a larger number of element regions.

Figure 2:
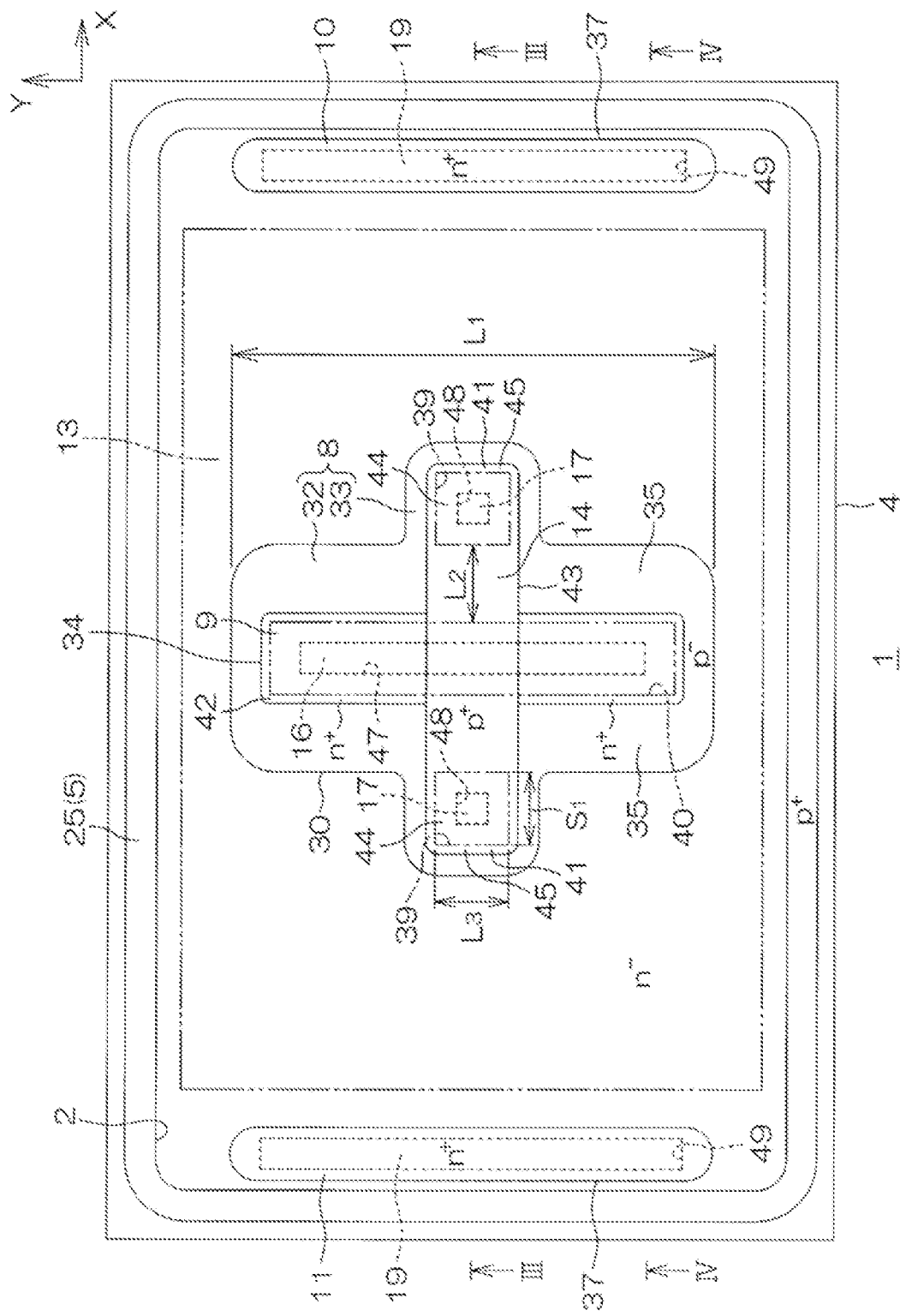
Figure 3:
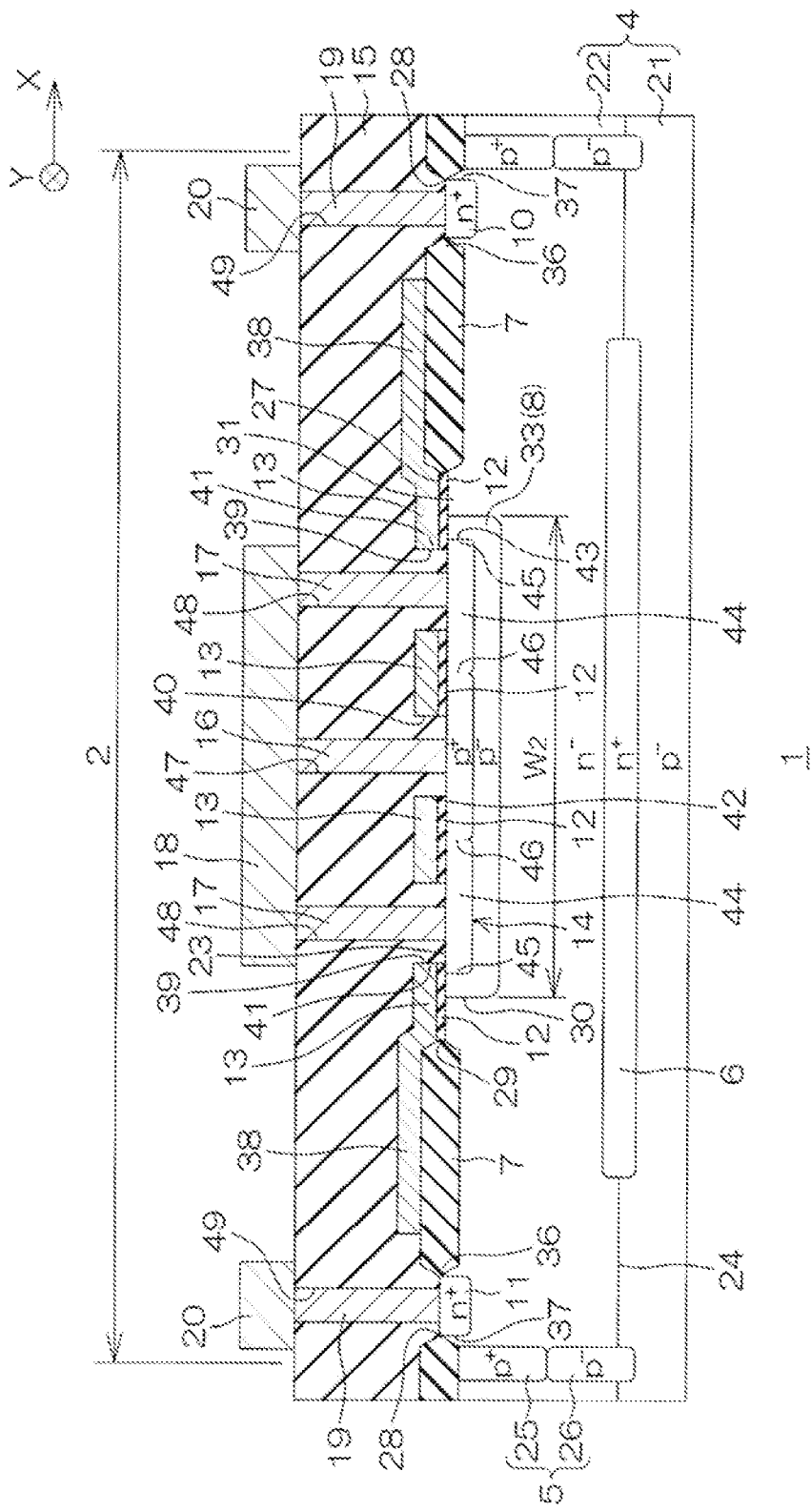
FIG. 3 is a cross-sectional view taken along line III-III in FIG. 2.
Figure 4:
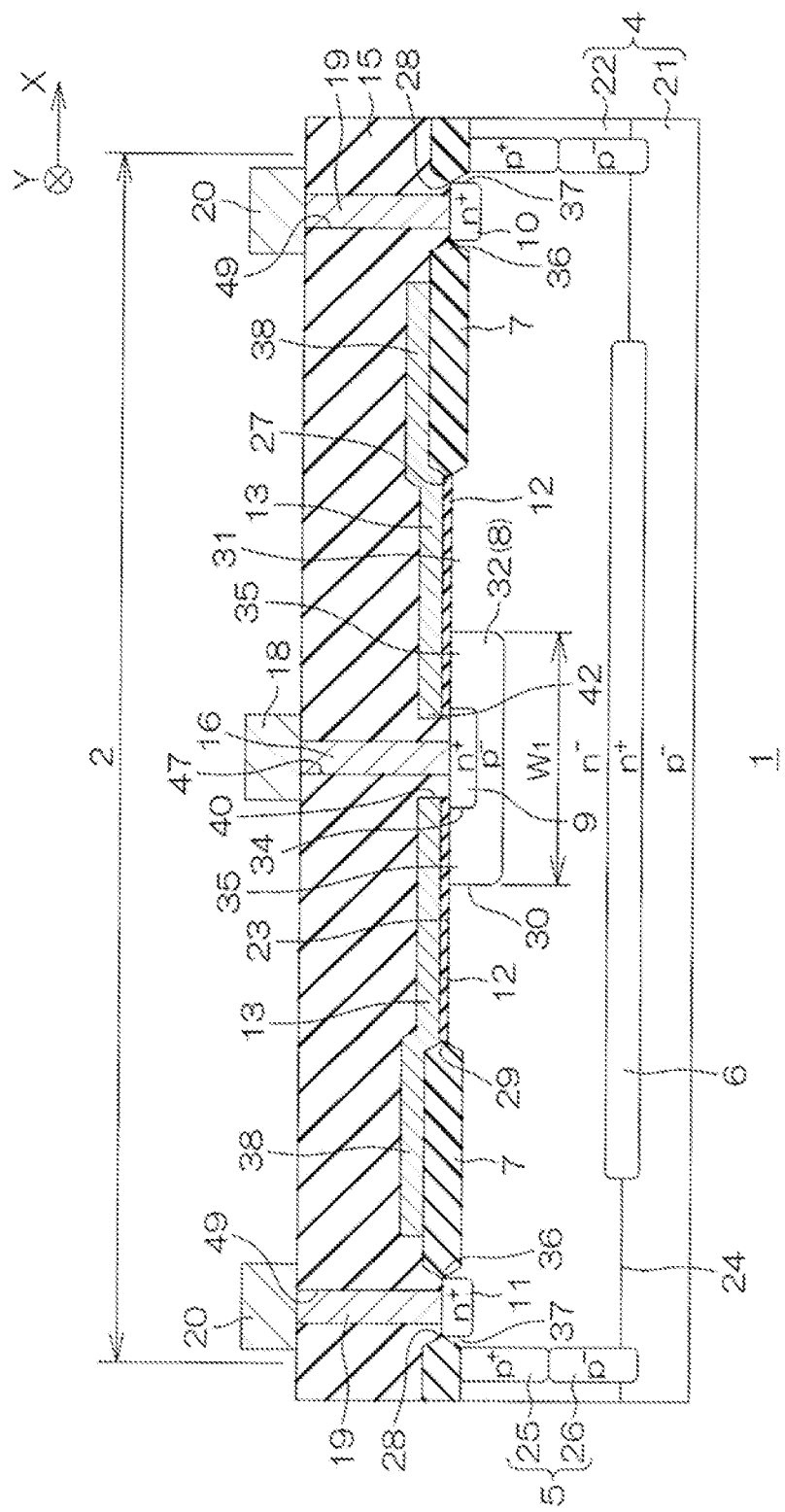
FIG. 4 is a cross-sectional view taken along line IV-IV in FIG. 2.

FIG. 2 is a schematic plan view of the semiconductor device 1 in which portions surrounded by two-dot chain line II in FIG. 1 is seen-through. FIG. 3 is a cross-sectional view taken along line III-III in FIG. 2. FIG. 4 is a cross-sectional view taken along line IV-IV in FIG. 2.

The semiconductor device 1 may include the semiconductor substrate 4, an element isolator 5, a buried layer 6, a field insulating film 7, a body region 8, a source region 9, drain regions 10 and 11, a gate insulating film 12, a gate electrode 13, a body contact region 14, an interlayer insulating film 15, a source contact 16, body contacts 17, a source wiring 18, drain contacts 19, and drain wirings 20.

The semiconductor substrate 4 may include a base substrate 21 and an epitaxial layer 22 as an example of a semiconductor layer of the present disclosure.

Although the base substrate 21 is formed of a silicon (Si) substrate in the present embodiment, the base substrate 21 may be a substrate formed of another material (for example, silicon carbide (SiC) or the like). The base substrate 21 is of a p$^-$-type in the present embodiment. The base substrate 21 may have, for example, an impurity concentration of $1\times10^{14}$ cm$^{-3}$ to $5\times10^{18}$ cm$^{-3}$. Further, a thickness of the base substrate 21 may be, for example, 500 μm to 800 μm before grinding.

The epitaxial layer 22 is in contact with the base substrate 21 and is laminated on the base substrate 21. The epitaxial layer 22 has an element main surface 23 and a bonding surface 24 facing the opposite side of the element main surface 23 in a thickness direction of the epitaxial layer 22. The element main surface 23 is a surface on which the element regions 2 and 3 are formed. The bonding surface 24 is a surface in contact with the base substrate 21. The epitaxial layer 22 has a conductive type opposite to that of the base substrate 21 and is of an n$^-$-type in the present embodiment. The epitaxial layer 22 may have, for example, an impurity concentration of $5\times10^{14}$ cm$^{-3}$ to $1\times10^{17}$ cm$^{-3}$. Further, a thickness of the epitaxial layer 22 may be, for example, 3 μm to 20 μm.

The element isolator 5 may include an element isolation well. More specifically, as shown in FIG. 2, a strip-shaped p-type element isolation well that draws a closed curve in a plan view may be formed so as to reach the base substrate 21 from the element main surface 23 of the epitaxial layer 22. In the present embodiment, the element isolator 5 is formed in a square annular shape in a plan view as shown in FIG. 2, but may have another closed curve structure such as a circular annular shape or a triangular annular shape.

The element isolator 5 may have a two-layer structure consisting of a p$^+$-type well region 25 disposed on the upper side and a p$^-$-type low isolation (L/I) region 26 disposed on the lower side. The boundary of these regions 25 and 26 may be set in the middle of the epitaxial layer 22 in the thickness direction. For example, the boundary of the regions 25 and 26 may be set at a depth position of 1.0 μm to 2.0 μm from the element main surface 23 of the epitaxial layer 22. As a result, the first element region 2 composed of a portion of the epitaxial layer 22 surrounded by the element isolator 5 on the base substrate 21 is partitioned in the semiconductor substrate 4.

The n$^+$-type buried layer 6 (B/L) is selectively formed in the first element region 2. The buried layer 6 is formed across the boundary between the base substrate 21 and the epitaxial layer 22 in the semiconductor substrate 4. A thickness of the buried layer 6 may be, for example, 2.0 μm to 3.0 μm.

Further, in the semiconductor substrate 4, the second element regions 3, which are electrically floated like the first element region 2, are partitioned in the outer peripheral region of the first element region 2. The second element regions 3 may be formed adjacent to the first element region 2 with the element isolator 5 interposed therebetween, or may be formed by an element isolation structure (not shown) (for example, a well similar to the element isolator 5) in a region separated from the first element region 2. The first element region 2 may be, for example, a low voltage element region that operates based on a low reference voltage of about 5 V to 100 V, or may be, for example, a high voltage element region that operates based on a high reference voltage of about 400 V to 600 V.

Although a specific edge is not shown in detail in FIG. 2, the field insulating film 7 is formed in a strip shape that draws a closed curve. Similar to the element isolator 5, the field insulating film 7 is formed in a square annular shape in a plan view so as to surround the periphery of the first element region 2. The field insulating film 7 is wider than the element isolator 5 and is formed so as to completely cover the element isolator 5.

The field insulating film 7 may be, for example, a LOCOS film formed by selectively oxidizing the element main surface 23 of the epitaxial layer 22. The field insulating film 7 has a first opening 27 that exposes the body region 8 and the source region 9, and second openings 28 that expose the drain regions 10 and 11.

The body region 8 is formed on the element main surface 23 of the epitaxial layer 22. The body region 8 is separated inward from a peripheral edge portion 29 of the first opening 27 of the field insulating film 7. An annular region sandwiched between an outer peripheral edge 30 of the body region 8 and the peripheral edge portion 29 of the field insulating film 7 and formed by a portion of the epitaxial layer 22 is a semiconductor region 31 having the same conductive type as the epitaxial layer 22.

The body region 8 includes a first portion 32 and a second portion 33. The first portion 32 extends in a second direction Y. The second portion 33 selectively protrudes from the middle portion in the second direction Y of the first portion 32, in the first direction X orthogonal to the second direction Y. More specifically, the first portion 32 may have a rectangular shape extending in the second direction Y, and the second portion 33 may have a rectangular shape intersecting the first portion 32 and extending in the first direction X. An intersecting portion between the first portion 32 and the second portion 33 may be a shared portion belonging to both the first portion 32 and the second portion 33. In other words, the body region 8 may have substantially a cross shape extending in both the first direction X and the second direction Y. Further, the body region 8 may include the first portion 32 of a line shape extending in the second direction Y, and the second portion 33 formed of a convex portion selectively protruding from the first portion 32.

As a result, the body region 8 has a first width $W_1$ of the first portion 32 and a second width $W_2$ of the second portion 33 with respect to the width measured along the first direction X. The second width $W_2$ is larger than the first width $W_1$. For example, the first width $W_1$ may be 0.1 μm to 1 μm, and the second width $W_2$ may be 0.3 μm to 3 μm. Further, when compared by ratio, the ratio ($W_2/W_1$) of the second width $W_2$ to the first width $W_1$ may be, for example, $W_2/W_1$=2 to 5. The first width $W_1$ and the second width $W_2$ do not have to be constant in the second direction Y. For example, when comparing the first widths $W_1$ at any two places in the second direction Y, the first widths $W_1$ may be different from each other.

Further, the body region 8 has a first length $L_1$ as a size along the second direction Y. The first length $L_1$ may be a length of the first portion 32. In FIG. 2, the body region 8 is shown to be relatively wide in order to clarify the structure of the semiconductor device 1, but the body region 8 may have a more elongated shape. That is, the first length $L_1$ of the body region 8 may be much larger than the first width $W_1$ and the second width $W_2$.

The body region 8 is a p⁻-type semiconductor region in the present embodiment. The body region 8 has, for example, an impurity concentration of $1\times10^{17}$ cm$^{-3}$ to $1\times10^{18}$ cm$^{-3}$. Further, a depth of the body region 8 may be deeper than the bottom position of the field insulating film 7 as shown in FIGS. 3 and 4. For example, the depth of the body region 8 may be 0.5 μm to 4.0 μm.

The source region 9 is formed in the inner region of the body region 8 on the element main surface 23 of the epitaxial layer 22. The source region 9 is separated inward from the outer peripheral edge 30 of the body region 8 and has an outer peripheral edge 34 along the outer peripheral edge 30 of the body region 8. When an appropriate voltage is applied to the gate electrode 13, a region sandwiched between the outer peripheral edge 30 of the body region 8 and the outer peripheral edge 34 of the source region 9 and composed of the body region 8 forms a channel, which corresponds to a channel region 35.

A plurality of source regions 9 is formed at intervals in the second direction Y. The body contact region 14 is formed between adjacent source regions 9 in the second direction Y. In the present embodiment, the source regions 9 are formed so as to sandwich the body contact region 14 in the second direction Y. In other words, the source region 9 may be divided by the body contact region 14 in the second direction Y.

The source region 9 is an n⁺-type semiconductor region in the present embodiment. The source region 9 has, for example, an impurity concentration of $1\times10^{19}$ cm$^{-3}$ to $5\times10^{21}$ cm$^{-3}$. Further, a depth of the source region 9 may be shallower than that of the body region 8. For example, the depth of the source region 9 may be 0.2 μm to 1.0 μm. Therefore, in a cross-sectional view, the side and bottom of the source region 9 are integrally covered by the body region 8.

The drain regions 10 and 11 are formed on the element main surface 23 of the epitaxial layer 22. The drain regions 10 and 11 are separated from the body region 8 in the first direction X, and have outer peripheral edges 37 along peripheral edge portions 36 of the second openings 28 of the field insulating film 7. Further, the drain regions 10 and 11 include a first drain region 10 and a second drain region 11 facing each other with the source region 9 interposed therebetween in the first direction X. Each of the first drain region 10 and the second drain region 11 extends along the second direction Y. In the present embodiment, the first drain region 10 and the second drain region 11 are formed in an elongated shape along the second direction Y.

The drain regions 10 and 11 are n⁺-type semiconductor regions in the present embodiment. The drain regions 10 and 11 have, for example, an impurity concentration of $1\times10^{19}$ cm$^{-3}$ to $5\times10^{21}$ cm$^{-3}$. Further, depths of the drain regions 10 and 11 may be, for example, 0.2 μm to 2.0 μm. For example, the drain regions 10 and 11 may have the same depth as the source region 9.

The gate insulating film 12 is formed on the element main surface 23 of the epitaxial layer 22. More specifically, the gate insulating film 12 is formed in a region extending from the outer peripheral edge 34 of the source region 9 to the peripheral edge portion 29 of the first opening 27 of the field insulating film 7 and is integral with the field insulating film 7. Further, the gate insulating film 12 covers the channel region 35 and the semiconductor region 31.

In the present embodiment, the gate insulating film 12 is formed of silicon oxide ($SiO_2$), but may be formed of other insulating materials (for example, silicon oxynitride film (SiON)). Further, a thickness of the gate insulating film 12 is thinner than that of the field insulating film 7. For example, the thickness of the gate insulating film 12 may be 2 nm to 55 nm.

The gate electrode 13 is formed on the gate insulating film 12. The gate electrode 13 faces the channel region 35 and the semiconductor region 31 via the gate insulating film 12, and extends continuously from the gate insulating film 12 onto the field insulating film 7. Thus, the gate electrode 13 covers a portion of the field insulating film 7. The portion of the gate electrode 13 on the field insulating film 7 may be referred to as, for example, a field plate 38.

In the present embodiment, the gate electrode 13 is a region partitioned by a two-dot chain line in FIG. 2. That is, the gate electrode 13 is formed in an annular shape surrounding the source region 9 and has a second opening 40 that exposes the source region 9. As shown in FIGS. 2 and 4, the source region 9 is formed to be larger than the second opening 40 and overlaps a peripheral edge portion 42 of the second opening 40. That is, the peripheral edge portion 42 of the second opening 40 is adjacent to the source region 9 in the thickness direction of the epitaxial layer 22. Further, in the present embodiment, the second opening 40 is an opening mainly for exposing the source region 9 and may be referred to as, for example, a source contact opening.

Further, the gate electrode 13 has a first opening 39 formed in a portion separated from the second opening 40 toward the drain region 10 or 11. As shown in FIG. 2, the first opening 39 of the gate electrode 13 is formed at a position overlapping the second portion 33 of the body region 8 in a plan view. Thus, the second portion 33 of the body region 8 is exposed from the first opening 39 of the gate electrode 13. As shown in FIG. 2, the first opening 39 of the gate electrode 13 may be entirely accommodated in a protruding portion of the second portion 33 of the body region 8. Further, the first opening 39 of the gate electrode 13 may be formed at a location inside the body region 8 further inward than the location thereof shown in FIG. 2 in the first direction X, and may be formed across the protruding portion of the second portion 33 and a part of the second portion 33 connected to the first portion 32 in the second direction Y.

Further, in the present embodiment, the first openings 39 of the gate electrode 13 are formed on a side of the first drain region 10 and on a side of the second drain region 11, respectively, with respect to the source region 9. In the first direction X, the pair of first openings 39 is formed so as to sandwich the second opening 40. In FIG. 2, the pair of first openings 39 is formed at locations symmetrical with respect to the second direction Y, but may not be formed in a positional relationship symmetrical with each other.

Each of the first openings 39 may be formed at a distance $L_2$ of 0.4 μm to 1.0 μm from the second opening 40. Further, widths $L_3$ and $S_1$ of each of the first openings 39 in the first direction X and the second direction Y, respectively, may be 0.4 μm to 1.0 μm. The widths $L_3$ and $S_1$ of each of the first openings 39 in the first direction X and the second direction Y, respectively, may be the same as or different from each other. Further, each of the first openings 39 is an opening for exposing the body contact region 14 in the present embodiment and may be referred to, for example, as a body contact opening.

Further, in the present embodiment, the gate electrode 13 includes, for example, a polysilicon gate electrode containing impurities. The contained impurities may be n-type impurities.

The body contact region 14 is formed on the element main surface 23 of the epitaxial layer 22 at a region inside the body region 8. The body contact region 14 is separated inward from the outer peripheral edge 30 of the body region 8 and has an outer peripheral edge 43 along the outer peripheral edge 30 of the body region 8.

In the present embodiment, the body contact region 14 is formed at least in the second portion 33 of the body region 8. The body contact region 14 is formed from the first opening 39 on the side of the first drain region 10 toward the first opening 39 on the side of the second drain region 11. Thus, the body contact region 14 is exposed from the first openings 39 and the second opening 40, and the surface of the body contact region 14 faces the inside of the first openings 39 and the second opening 40. Further, as shown in FIGS. 2 and 3, the body contact region 14 is formed to be larger than the first openings 39 and overlaps peripheral edge portions 41 of the first openings 39. That is, the peripheral edge portions 41 of the first openings 39 are adjacent to the body contact region 14 in the thickness direction of the epitaxial layer 22.

The body contact region 14 may have a wider width than the source region 9 in the first direction X. In other words, the body contact region 14 may have convex portions 44 protruding from the outer peripheral edge 34 of the source region 9 toward the drain regions 10 and 11, respectively, in the first direction X. In other words, the body contact region 14 may have end portions 45 in the first direction X at locations closer to the drain regions 10 and 11, respectively, than the outer peripheral edge 34 of the source region 9.

The body contact region 14 may have a line shape along the first direction X, for example, as shown in FIG. 2. Thus, as shown in FIG. 2, the source region 9 and the body contact region 14 may intersect each other in a plan view. The source region 9 is divided by the body contact region 14 in the second direction Y.

Further, the body contact region 14 may be integrally formed from the first opening 39 on the side of the first drain region 10 toward the first opening 39 on the side of the second drain region 11 via the second opening 40. That is, the body contact region 14 may be continuous without interruption below the gate electrode 13 between the second opening 40 and the first openings 39. In this case, as shown in FIG. 3, the body contact region 14 may have portions 46 having selectively shallow depths from the element main surface 23, below the gate electrode 13 between the second opening 40 and the first openings 39.

In the present embodiment, the body contact region 14 is a p$^+$-type semiconductor region and has a higher impurity concentration than the body region 8. The body contact region 14 has, for example, an impurity concentration of $1 \times 10^{19}$ cm$^{-3}$ to $5 \times 10^{21}$ cm$^{-3}$, specifically $1 \times 10^{19}$ cm$^{-3}$ to $1 \times 10^{20}$ cm$^{-3}$. Further, a depth of the body contact region 14 (a depth of the deepest portion) may be shallower than that of the body region 8. For example, the depth of the body contact region 14 may be 0.2 μm to 1.0 μm. Therefore, in a cross-sectional view, the side portion and the bottom of the body contact region 14 are integrally covered by the body region 8.

The interlayer insulating film 15 is formed on the element main surface 23 of the epitaxial layer 22. The interlayer insulating film 15 covers the body region 8, the source region 9, the drain regions 10 and 11, and the gate electrode 13. In the present embodiment, the interlayer insulating film 15 is formed of silicon oxide (SiO$_2$), but may be formed of another insulating material (for example, silicon nitride (SiN) or the like). Further, the interlayer insulating film 15 may be composed of a plurality of materials, for example, a laminated structure of silicon oxide and silicon nitride. Further, a thickness of the interlayer insulating film 15 may be, for example, 0.3 μm to 2.0 μm.

The source contact 16 is buried in the interlayer insulating film 15. More specifically, a source contact hole 47 extending from the surface of the interlayer insulating film 15 to the source region 9 and the body contact region 14 through the second opening 40 is formed in the interlayer insulating film 15. The source contact hole 47 is formed in a line shape along the second direction Y and exposes the source region 9 and the body contact region 14 commonly. The source contact 16 is buried in the source contact hole 47 and is collectively connected to the source region 9 and the body contact region 14. As shown in FIG. 2, the source contacts 16 may be formed in a line shape along the second direction Y, or, although not shown, a plurality of source contacts 16 may be arranged in a dot shape at intervals along the second direction Y.

Further, although the source contact 16 is formed of tungsten (W) in the present embodiment, it may be formed of another conductive material (for example, aluminum (Al), copper (Cu), or the like). At that time, it goes without saying that a barrier film such as TiN or the like may be used.

The body contacts 17 are buried in the interlayer insulating film 15. More specifically, body contact holes 48 extending from the surface of the interlayer insulating film 15 to the body contact region 14 via the first opening 39 are formed in the interlayer insulating film 15. The body contacts 17 are buried in the body contact holes 48 and are connected to the body contact region 14.

Further, although the body contacts 17 are formed of tungsten (W) in the present embodiment, the body contacts 17 may be formed of another conductive material (for example, aluminum (Al), copper (Cu), or the like). At that time, it goes without saying that a barrier film such as TiN or the like may be used.

The source wiring 18 is formed on the surface of the interlayer insulating film 15. The source wiring 18 covers the source contact 16 and the body contacts 17, and is connected to the source contact 16 and the body contacts 17. Thus, the source wiring 18 is electrically connected to the source region 9 and the body contact region 14.

Although the source wiring 18 is formed of aluminum (Al) in the present embodiment, the source wiring 18 may be formed of another conductive material (for example, copper (Cu), or the like). The source wiring 18 may be referred to as a source electrode depending on a shape (pattern) thereof.

The drain contacts 19 are buried in the interlayer insulating film 15. More specifically, drain contact holes 49 extending from the surface of the interlayer insulating film 15 to the drain regions 10 and 11 are formed in the interlayer insulating film 15. The drain contact holes 49 are formed in a line shape along the second direction Y and expose the drain regions 10 and 11. The drain contacts 19 are buried in the drain contact holes 49 and are connected to the drain regions 10 and 11. The drain contacts 19 may be formed in a line shape along the second direction Y, as shown in FIG. 2, or, although not shown, a plurality of drain contacts 19 may be arranged in a dot shape at intervals along the second direction Y.

Further, although the drain contacts 19 are formed of tungsten (W) in the present embodiment, the drain contacts 19 may be formed of another conductive material (for example, aluminum (Al), copper (Cu), or the like). At that time, it goes without saying that a barrier film such as TiN or the like may be used.

The drain wirings 20 are formed on the surface of the interlayer insulating film 15. The drain wirings 20 cover the drain contacts 19 and are connected to the drain contacts 19. Thus, the drain wirings 20 are electrically connected to the drain regions 10 and 11.

Although the drain wirings 20 are formed of aluminum (Al) in the present embodiment, the drain wirings 20 may be formed of another conductive material (for example, copper (Cu) or the like). The drain wirings 20 may be referred to as drain electrodes depending on a shape (pattern) thereof.

(Method of Manufacturing Semiconductor Device 1)

Figure 6:
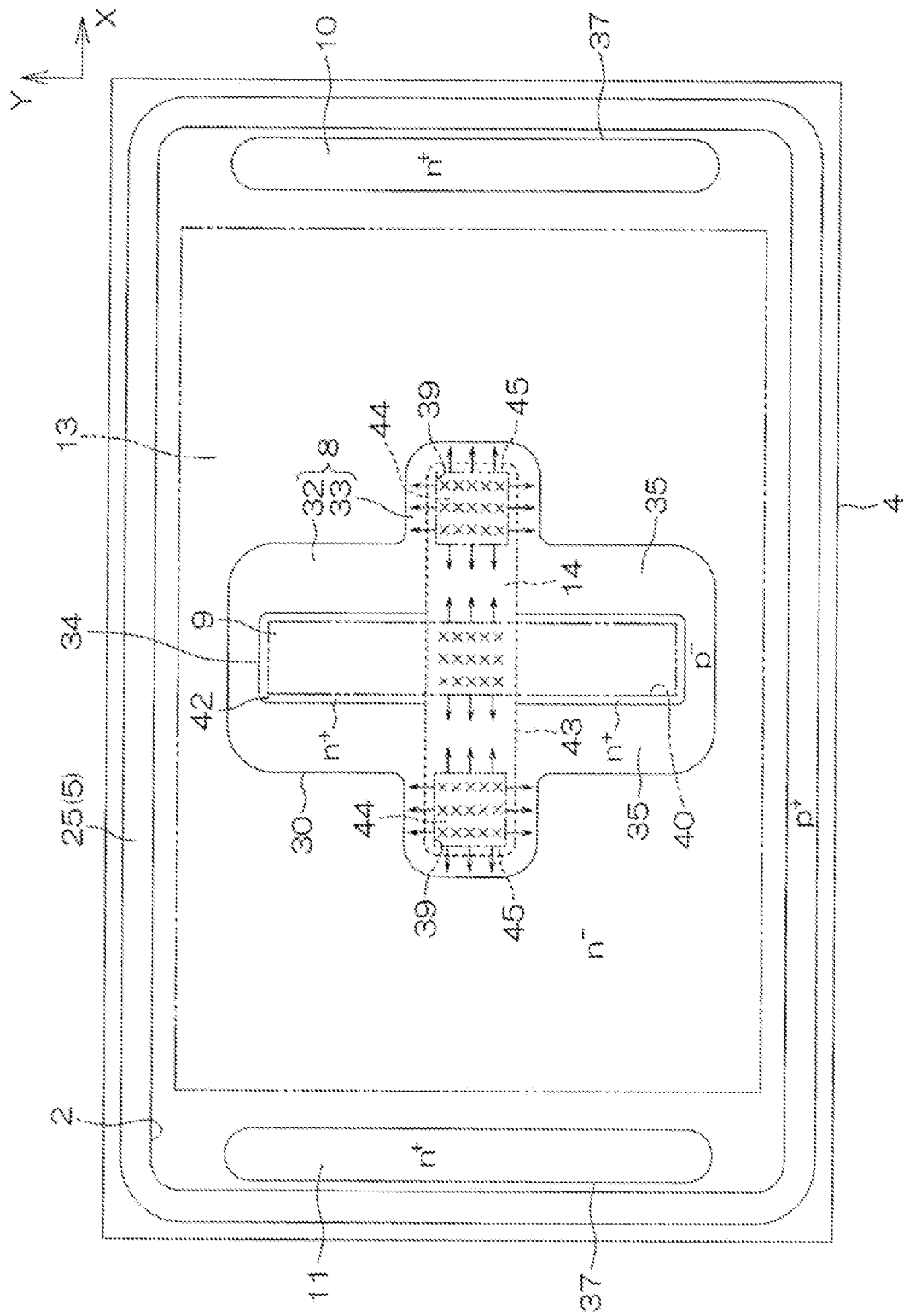
FIG. 6 is a view showing a process related to formation of a body contact region.
Figure 7:
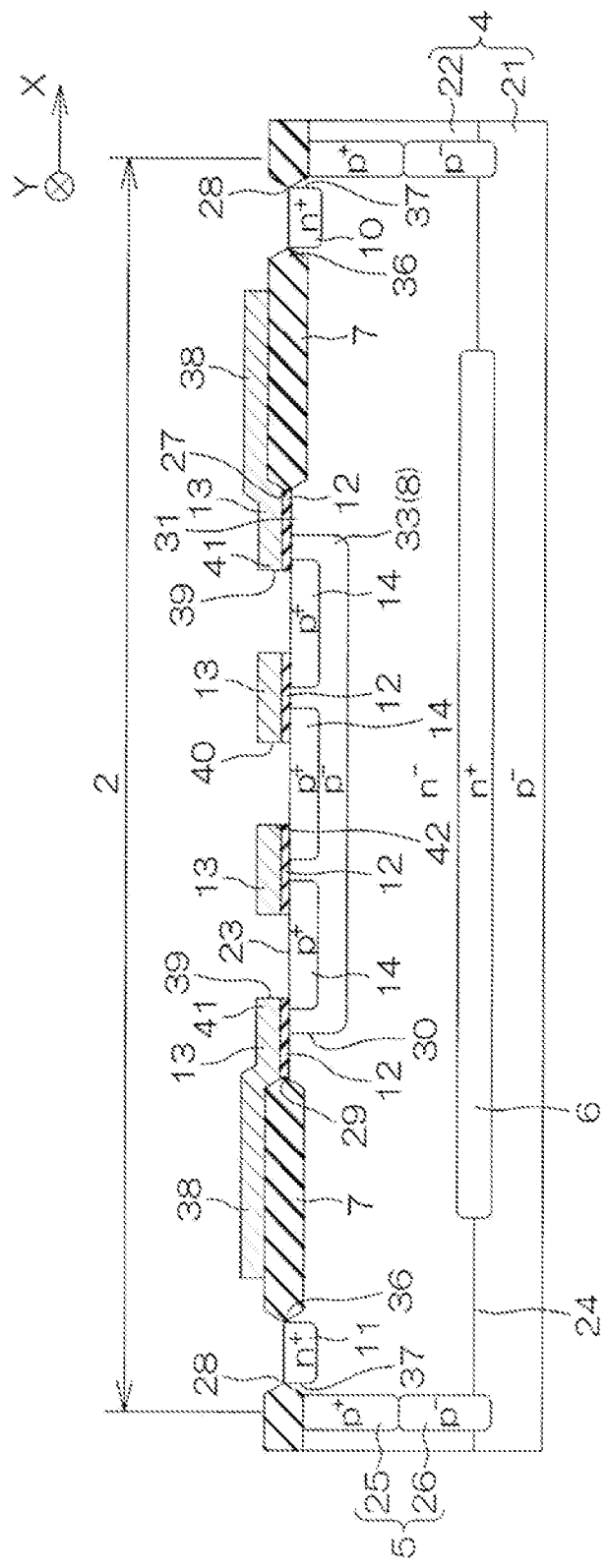
FIG. 7 is a view showing a process related to formation of a body contact region.
Figure 8:
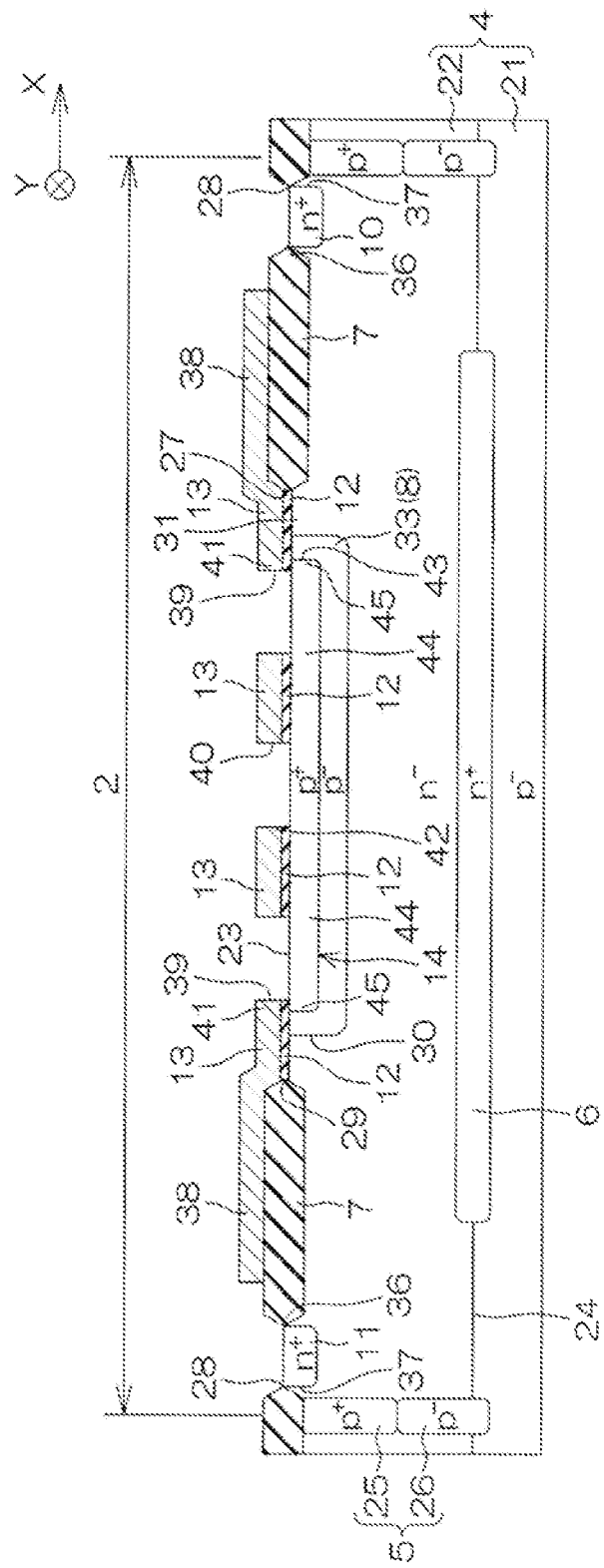
FIG. 8 is a view showing a process related to formation of a body contact region.

FIGS. 5A to 5H are diagrams showing processes in manufacturing the semiconductor device 1 in process order. FIGS. 6 to 8 are diagrams showing processes related to formation of the body contact region 14.

Figure 5B:
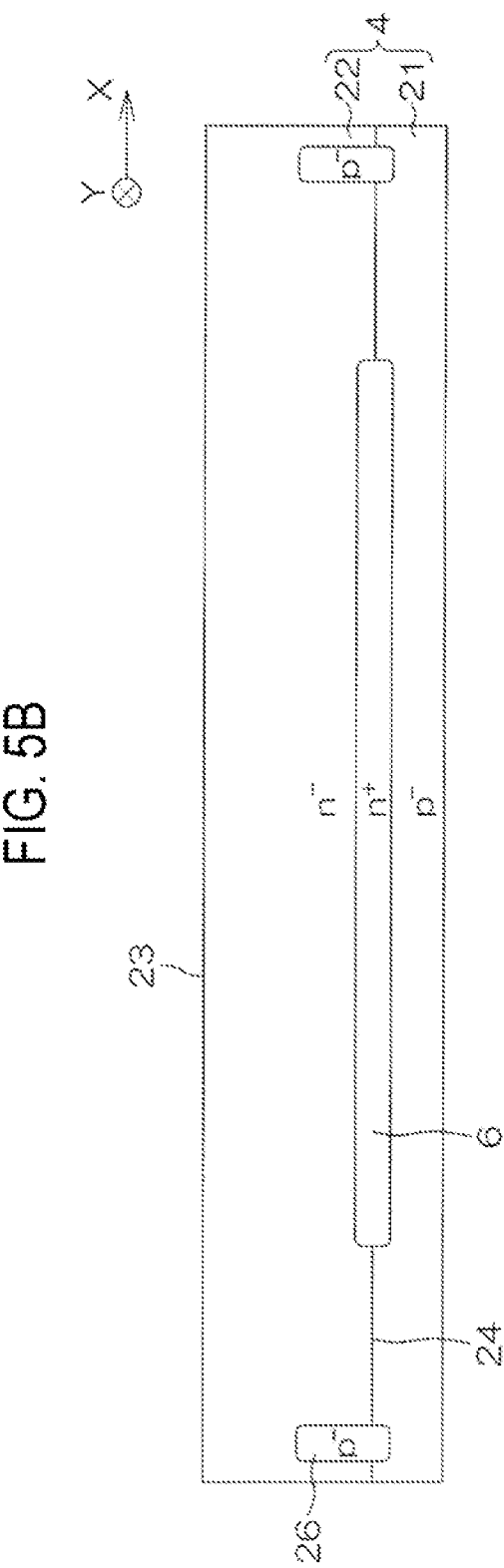
FIG. 5B is a view showing a next process of FIG. 5A.

In order to manufacture the semiconductor device 1, the p$^-$-type base substrate 21 is prepared as shown in FIG. 5A. Subsequently, n-type impurities and p-type impurities are selectively implanted into the surface of the base substrate 21. Further, for example, under a temperature of 1,100 degrees C. or higher, silicon of the base substrate 21 is epitaxially grown while adding n-type impurities. Thus, as shown in FIG. 5B, the semiconductor substrate 4 including the p$^-$-type base substrate 21 and the n$^-$-type epitaxial layer 22 is formed.

When the base substrate 21 is epitaxially grown, the n-type impurities and the p-type impurities implanted into the base substrate 21 diffuse in a growth direction of the epitaxial layer 22. Thus, the buried layer 6 and the p$^-$-type low isolation region 26 are formed across the boundary between the base substrate 21 and the epitaxial layer 22. Examples of the p-type impurities may include B (boron), Al (aluminum), and the like, and examples of the n-type impurities may include P (phosphorus), As (arsenic), and the like.

Subsequently, as shown in FIG. 5C, an ion implantation mask (not shown) having an opening formed selectively in a region where the p$^+$-type well region 25 is to be formed is formed on the epitaxial layer 22. Further, p-type impurities are implanted into the epitaxial layer 22 via the ion implantation mask. Thus, the element isolator 5 (element isolation well) having a two-layer structure of the p$^+$-type well region 25 and the p$^-$-type low isolation region 26 is formed. After the element isolator 5 is formed, the ion implantation mask is removed.

Subsequently, a hard mask 50 having an opening formed selectively in a region where the field insulating film 7 is to be formed is formed on the epitaxial layer 22. Further, the element main surface 23 of the epitaxial layer 22 is subjected to a thermal oxidation treatment via the hard mask 50, thereby forming the field insulating film 7 formed of a LOCOS film. Thereafter, the hard mask 50 is removed.

Figure 5D:
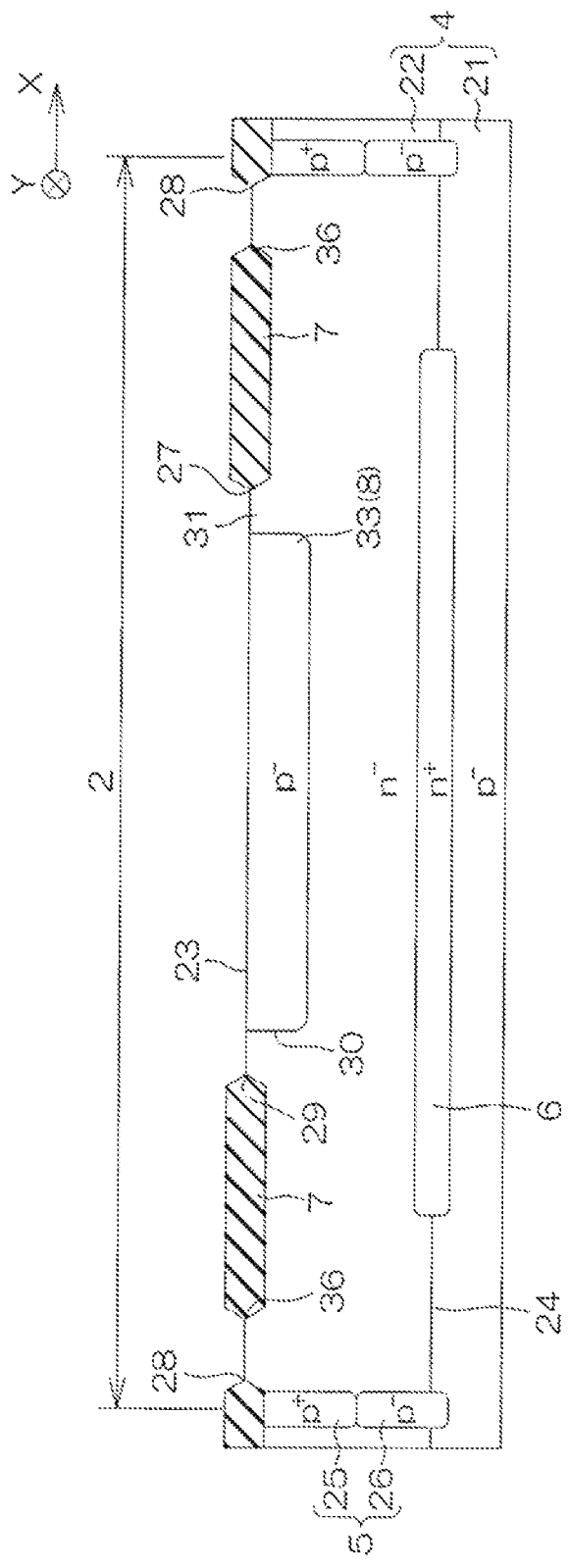
FIG. 5D is a view showing a next process of FIG. 5C.

Subsequently, as shown in FIG. 5D, an ion implantation mask (not shown) having an opening formed selectively in a region where the p$^-$-type body region 8 is to be formed is formed on the epitaxial layer 22. Further, p-type impurities are implanted into the epitaxial layer 22 via the ion implantation mask. Thus, the p$^-$-type body region 8 is formed. After the body region 8 is formed, the ion implantation mask is removed.

Subsequently, as shown in FIG. 5E, the element main surface 23 of the epitaxial layer 22 is subjected to a thermal oxidation treatment to form the gate insulating film 12. At this time, the gate insulating film 12 is formed so as to be continuous to the field insulating film 7. Subsequently, polysilicon for the gate electrode 13 is deposited on the epitaxial layer 22 to form a polysilicon layer 51.

Subsequently, as shown in FIG. 5F, a resist mask (not shown) having openings formed selectively in a region where the gate electrode 13 is to be formed is formed on the polysilicon layer 51. Further, unnecessary portions of the polysilicon layer 51 are removed by an etching process via the resist mask. Thus, the first openings 39 and the second opening 40 are formed at the same time, and the gate electrode 13 is formed.

Subsequently, in order to remove unnecessary portions of the gate insulating film 12, a hard mask (not shown) having selectively formed openings is formed on the epitaxial layer 22. Further, the unnecessary portions of the gate insulating film 12 are subjected to an etching process via the hard mask. Thus, the predetermined gate insulating film 12 is formed. After the gate insulating film 12 is formed, the hard mask is removed.

Subsequently, as shown in FIG. 5G, the n$^+$-type source region 9, the n$^+$-type drain regions 10 and 11, and the p$^+$-type body contact region 14 are formed. In order to form the source region 9 and the drain regions 10 and 11, first, an ion implantation mask (not shown) having openings formed selectively in a region where the source region 9 and the drain regions 10 and 11 are to be formed is formed. Further, n-type impurities are implanted into the epitaxial layer 22 via the ion implantation mask. In addition, in the same procedure, an ion implantation mask (not shown) having an opening formed selectively in a region where the body contact region 14 is to be formed is formed. Further, p-type impurities are implanted into the epitaxial layer 22 via the ion implantation mask.

After the ion implantation, the ion implantation masks are removed. Thereafter, for example, by a heat treatment under a temperature of 1,100 degrees C. or higher, the n-type impurities and the p-type impurities implanted into the epitaxial layer 22 are diffused. Thus, the n$^+$-type source region 9, the n$^+$-type drain regions 10 and 11, and the p$^+$-type body contact region 14 are formed.

At the time of the ion implantation described above, the gate electrode 13 serves as an obstacle to a portion of the epitaxial layer 22 covered with the gate electrode 13, and the n-type impurities and the p-type impurities are prevented from being implanted into the epitaxial layer 22. That is, the n-type impurities and the p-type impurities are selectively implanted into the element main surface 23 of the epitaxial layer 22 exposed from the openings of the ion implantation masks (not shown) and from the first openings 39 and the second opening 40.

On the other hand, the n-type impurities and the p-type impurities implanted into the epitaxial layer 22 diffuse not only in the thickness direction of the epitaxial layer 22 but also in a lateral direction along the element main surface 23 by a heat treatment. Therefore, for example, when diffusing the p-type impurities for the body contact region 14, the p-type impurities (x) diffuse outward from the peripheral edges 41 of the first openings 39 and the peripheral edge portion 42 of the second opening 40, as shown in FIG. 6. As a result, below the gate electrode 13, portions of the body contact region 14 extending from the first openings 39 and the second opening 40 are connected to one another, and the body contact region 14 is continuous without interruption as shown in FIG. 3.

At this time, by simply changing heat treatment conditions, the portions of the body contact region 14 may be separated from one another below the gate electrode 13, as shown in FIG. 7, or the body contact region 14 may have the same depth below the gate electrode 13 and below the first openings 39 and the second opening 40, as shown in FIG. 8.

Subsequently, as shown in FIG. 5H, an insulating material is deposited so as to cover the gate electrode 13, thereby forming the interlayer insulating film 15. Subsequently, the source contact 16, the body contacts 17, and the drain contacts 19 are formed so as to penetrate the interlayer insulating film 15, and are electrically connected to the source region 9, the body contact region 14, and the drain regions 10 and 11, respectively.

Subsequently, the source wiring 18 electrically connected to the source contact 16 and the body contacts 17 and the drain wirings 20 electrically connected to the drain contacts 19 are selectively formed on the interlayer insulating film 15. In order to form the source wiring 18 and the drain wirings 20, a resist mask having predetermined openings formed in a region where the source wiring 18 and the drain wirings 20 are to be formed is formed. Further, the source wiring 18 and the drain wirings 20 can be formed by depositing an electrode material via the resist mask. Through the processes described above, the semiconductor device 1 according to the first embodiment is manufactured.

Second Embodiment

Figure 9:
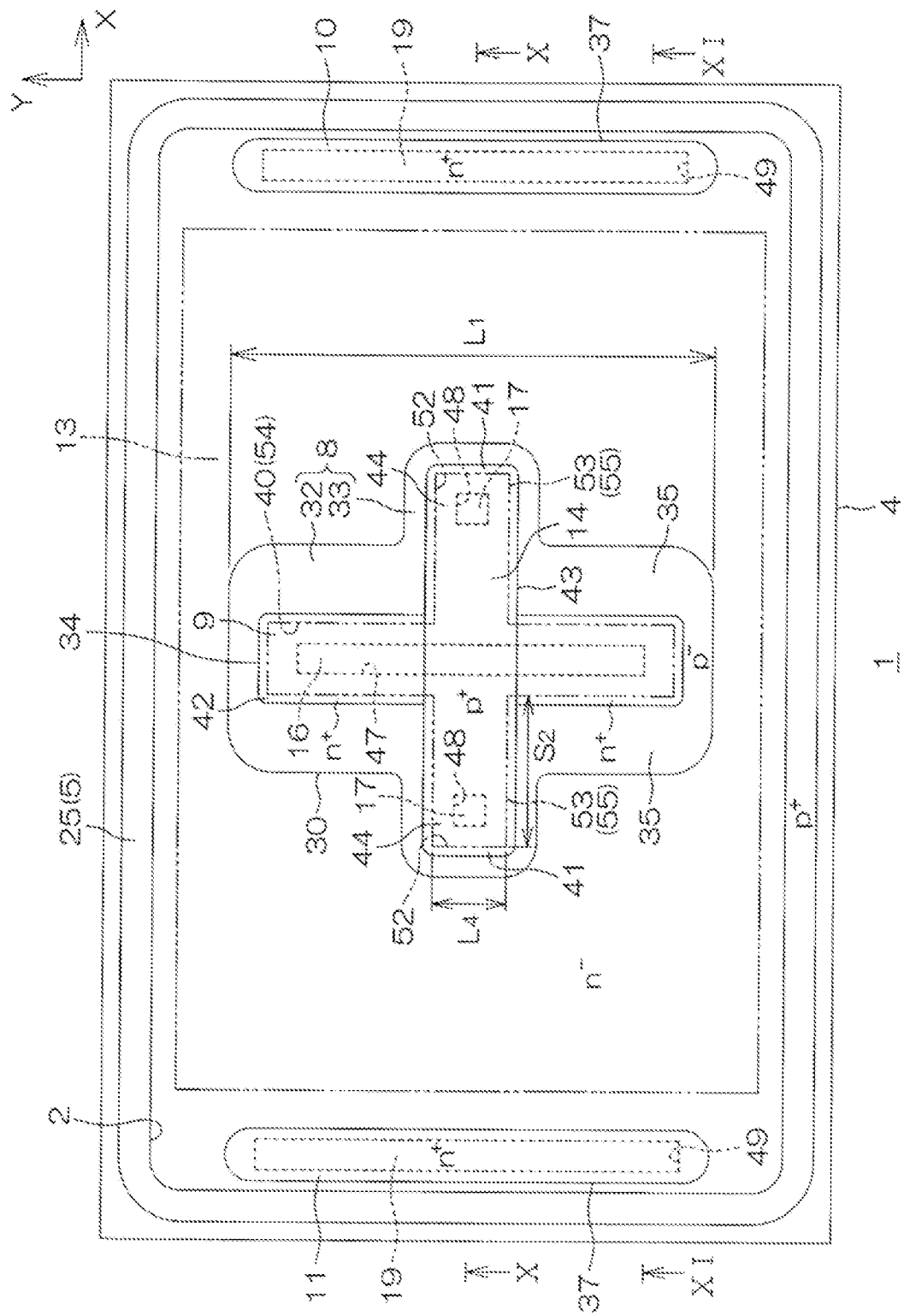
FIG. 9 is a partial schematic plan view of a semiconductor device according to a second embodiment of the present disclosure.
Figure 10:
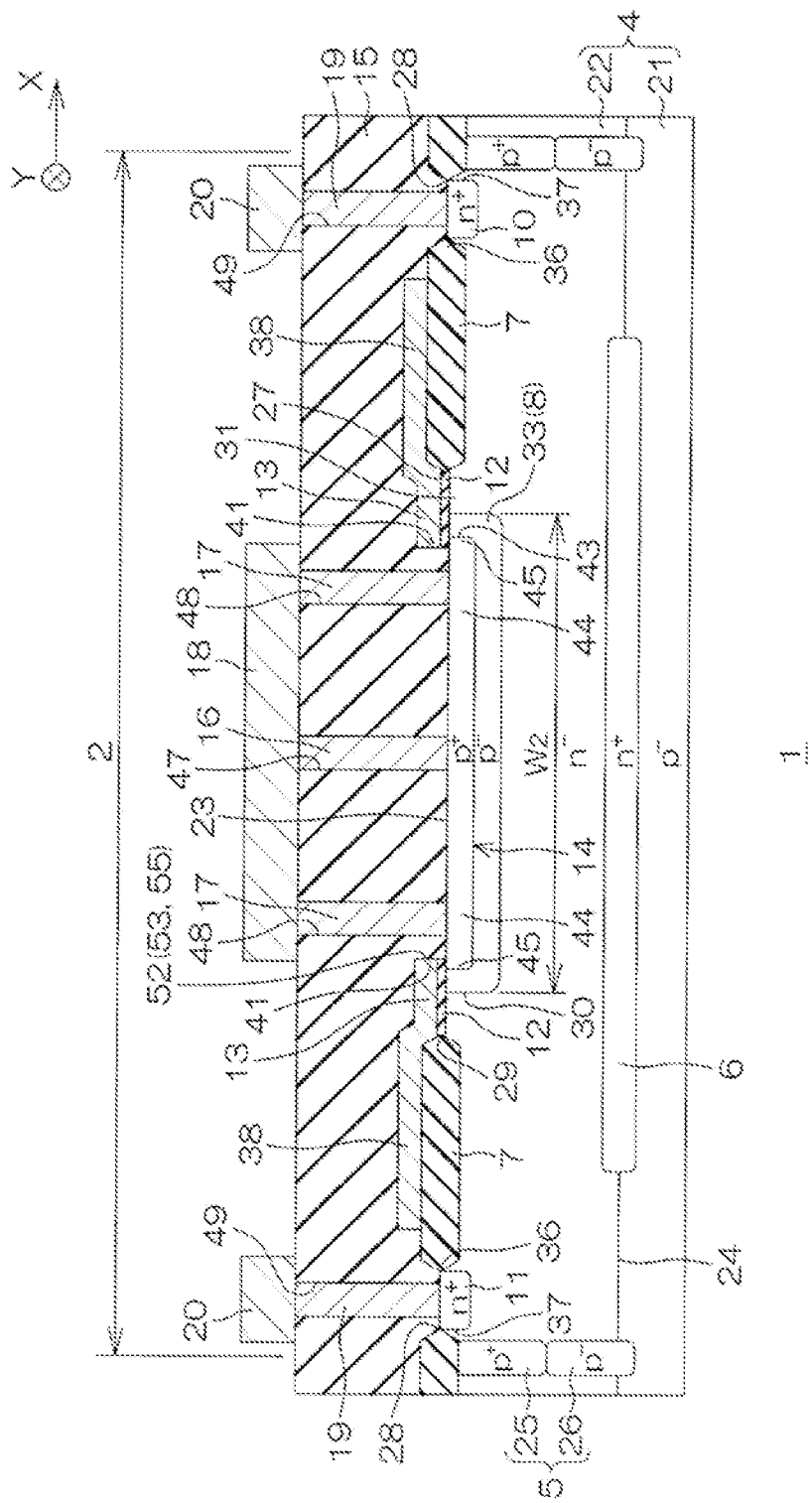
FIG. 10 is a cross-sectional view taken along line X-X in FIG. 9.
Figure 11:
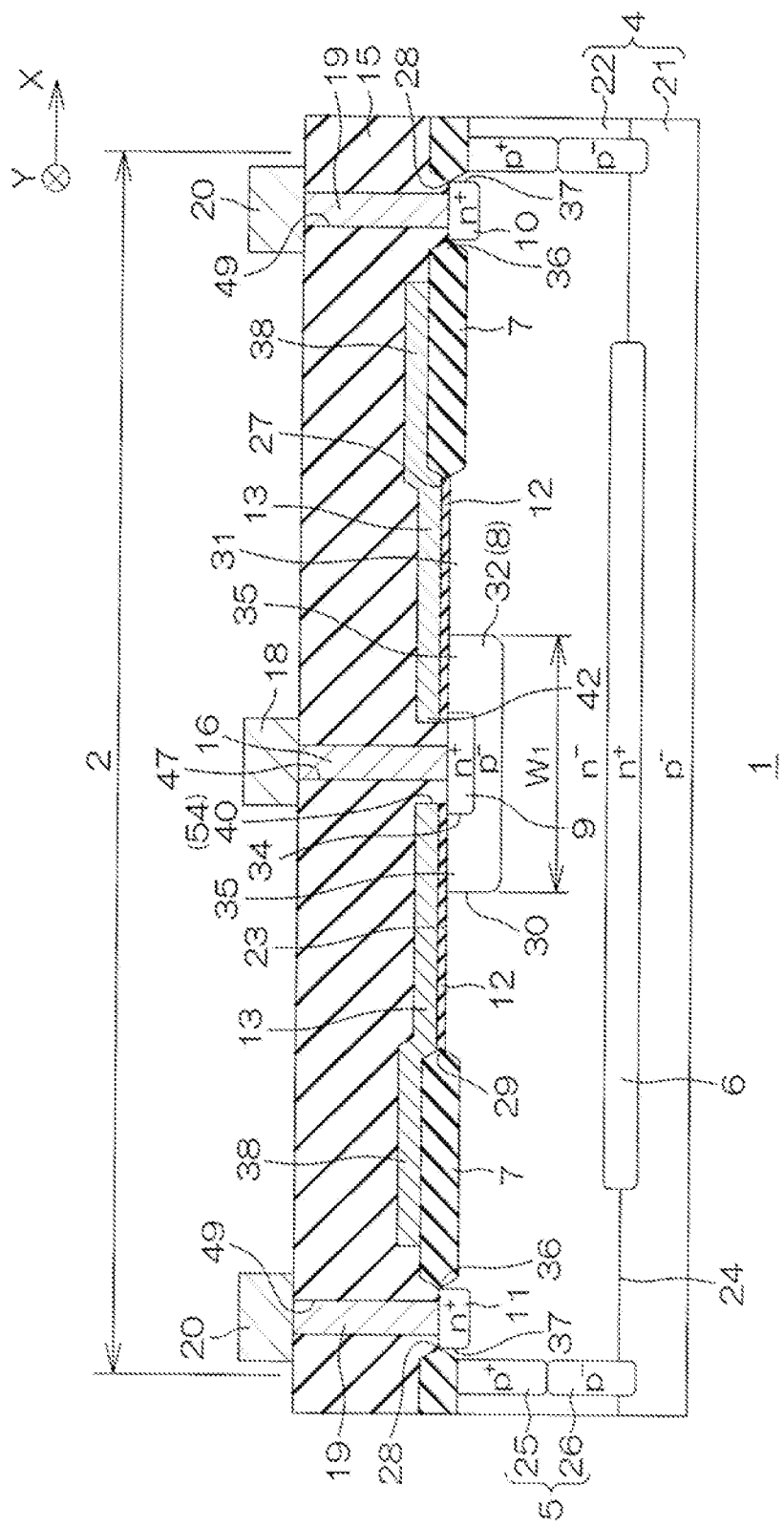
FIG. 11 is a cross-sectional view taken along line XI-XI in FIG. 9.

FIG. 9 is a schematic plan view of a portion of a semiconductor device 1 according to a second embodiment of the present disclosure. FIG. 10 is a cross-sectional view taken along line X-X in FIG. 9. FIG. 11 is a cross-sectional view taken along line XI-XI in FIG. 9. In FIGS. 9 to 11, elements that are the same as or similar to those of the above-described embodiment are denoted by the same reference numerals as those of the above-described embodiment, and the explanation thereof will be omitted.

In the semiconductor device 1 according to the first embodiment, the first openings 39 having a shape for exposing a convex portion (the second portion 33) of the body region 8 are formed in the gate electrode 13. By contrast, in the semiconductor device 1 according to the second embodiment, the gate electrode 13 has concave portions 52, which are continuous to the second opening 40 and are portions of the peripheral edge portion 42 of the second opening 40 selectively recessed toward the drain regions 10 and 11, respectively. In other words, the second opening 40 may have convex portions 53 that selectively protrude toward the drain regions 10 and 11, respectively. Further, the second opening 40 may include a line-shaped first portion 54 extending along the second direction Y and a second portion 55 that selectively protrudes along the first direction X from a middle of the first portion 54 in the second direction Y. Furthermore, the concave portions 52 may be referred to as a notch because the concave portions 52 have a form where portions of the gate electrode 13 are cut out from the peripheral edge portion 42 of the second opening 40.

As shown in FIG. 9, the concave portions 52 of the gate electrode 13 are formed at locations overlapping the second portion 33 of the body region 8 in a plan view. Thus, the second portion 33 of the body region 8 is exposed from the concave portions 52 of the gate electrode 13.

In the present embodiment, the concave portions 52 of the gate electrode 13 are formed toward the first drain region 10 and the second drain region 11, respectively, with respect to the second opening 40. In the first direction X, the pair of concave portions 52 is formed so as to sandwich the second opening 40. In FIG. 9, the pair of concave portions 52 is formed at locations symmetrical with respect to the second direction Y, but may not be formed in a positional relationship symmetrical with each other.

Further, widths $S_2$ and $L_4$ of each of the concave portions 52 in the first direction X and the second direction Y, respectively, may be 0.4 μm to 1.0 μm. The widths $S_2$ and $L_4$ of each of the concave portions 52 in the first direction X and the second direction Y, respectively, may be the same as or different from each other. Further, each of the concave portions 52 is a concave portion for exposing the body contact region 14 in the present embodiment and may be referred to as, for example, a concave portion for the body contact 17.

The body contact region 14 is formed from the concave portion 52 on the side of the first drain region 10 toward the concave portion 52 on the side of the second drain region 11. Thus, the body contact region 14 is exposed from the concave portions 52 and the second opening 40, and the surface of the body contact region 14 faces the inside of the concave portions 52 and the second opening 40.

The gate electrode 13 having such concave portions 52 can be obtained, for example, by simply changing a layout of the resist mask in the process of FIG. 5F described above.

[Effects Generated from Semiconductor Device 1]

The semiconductor device 1 described above includes an npn parasitic bipolar transistor formed by the n$^+$-type source region 9, the p$^-$-type body region 8, and the n$^+$-type drain regions 10 and 11 arranged in the first direction X along the element main surface 23 of the epitaxial layer 22.

Such a type of parasitic bipolar transistor may be turned on when an overvoltage is applied between the source and the drain due to, for example, ESD (Electro-Static Discharge). As a result, a large local current is generated in a MISFET including the source region 9, the body region 8, and the drain regions 10 and 11, which may lead to destruction of MISFET. As measures against ESD, it is desirable to prepare an environment in which it is difficult for the parasitic bipolar transistor to be turned on.

For example, an npn bipolar transistor is turned on by applying a forward bias between the base and the emitter of the npn bipolar transistor. Therefore, it is desirable to prevent the npn bipolar transistor from being turned on by suppressing the potential rise in the base region (the body region 8 in the present embodiment) to suppress the application of the forward bias.

Therefore, in the semiconductor device 1, the first openings 39 or the concave portions 52 are formed in the gate electrode 13, and the body contact region 14 is formed in the first openings 39 or the concave portions 52. Thus, in the first direction X, the potential of the body region 8 can be provided from the body contact region 14 at locations close to the drain regions 10 and 11 with respect to the source region 9. Therefore, in the first direction X, the potential rise of the body region 8 from the source region 9 toward the drain regions 10 and 11 can be suppressed. As a result, it is possible to suppress the turn-on of the parasitic bipolar transistor.

Further, a current amplification factor ($h_{FE}$) of a bipolar transistor generally decreases as a concentration in the base region (the body region 8 in the present embodiment) increases. In the semiconductor device 1, since the body contact region 14 having a higher concentration than the body region 8 is formed wider in the first direction X, the ability of the bipolar transistor is lowered, which can result in suppression of the turn-on of the parasitic bipolar transistor.

Therefore, it is possible to provide the semiconductor device 1 having improved ESD resistance, and when necessary, it is possible to reduce the number of ESD protection elements. With the reduction of the number of ESD protection elements, a chip area can be reduced, and costs can also be reduced. Further, since an ESD design becomes unnecessary, the design of the semiconductor device 1 can be simplified.

[Result of Machine Model Test]

Figure 12:
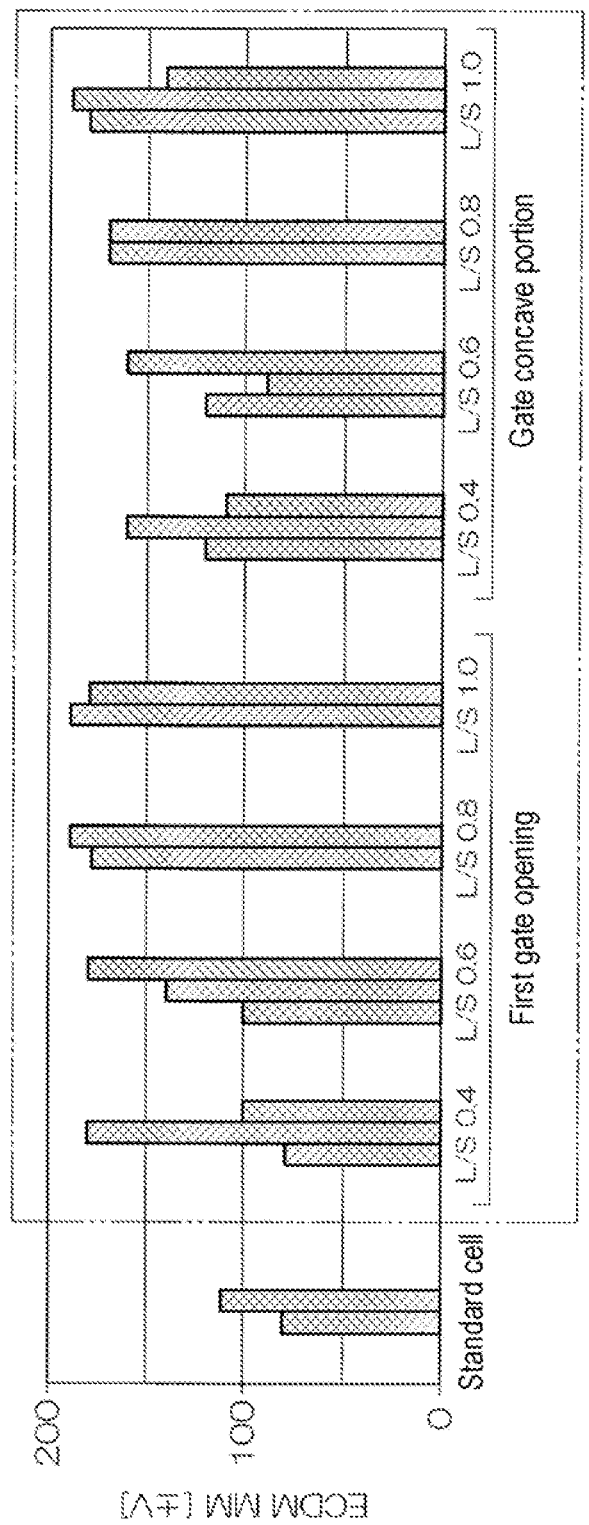
FIG. 12 is a diagram showing a result of a machine model test.

FIG. 12 is a diagram showing a result of a machine model test. An ESD withstand voltage test was carried out on the above-described semiconductor device 1, and the result of the test is shown in FIG. 12. In FIG. 12, "L/S" indicates sizes of the first openings 39 and the concave portions 52. For the ESD withstand voltage test, "ECDM-400E (product name)" manufactured by Tokyo Denshi Trading Co., Ltd. was used. In the machine model test, ESD in a range of 0 V to 800 V is applied to adjacent input terminals and output terminals.

As shown in FIG. 12, in the semiconductor device 1 including the gate electrode 13 having the first openings 39 or the concave portions 52, although there was a sample having a lower withstand voltage inferior to that of a semiconductor device (standard cell) without having the first openings 39 and the concave portions 52, the withstand voltage was improved as a whole.

Figure 13:
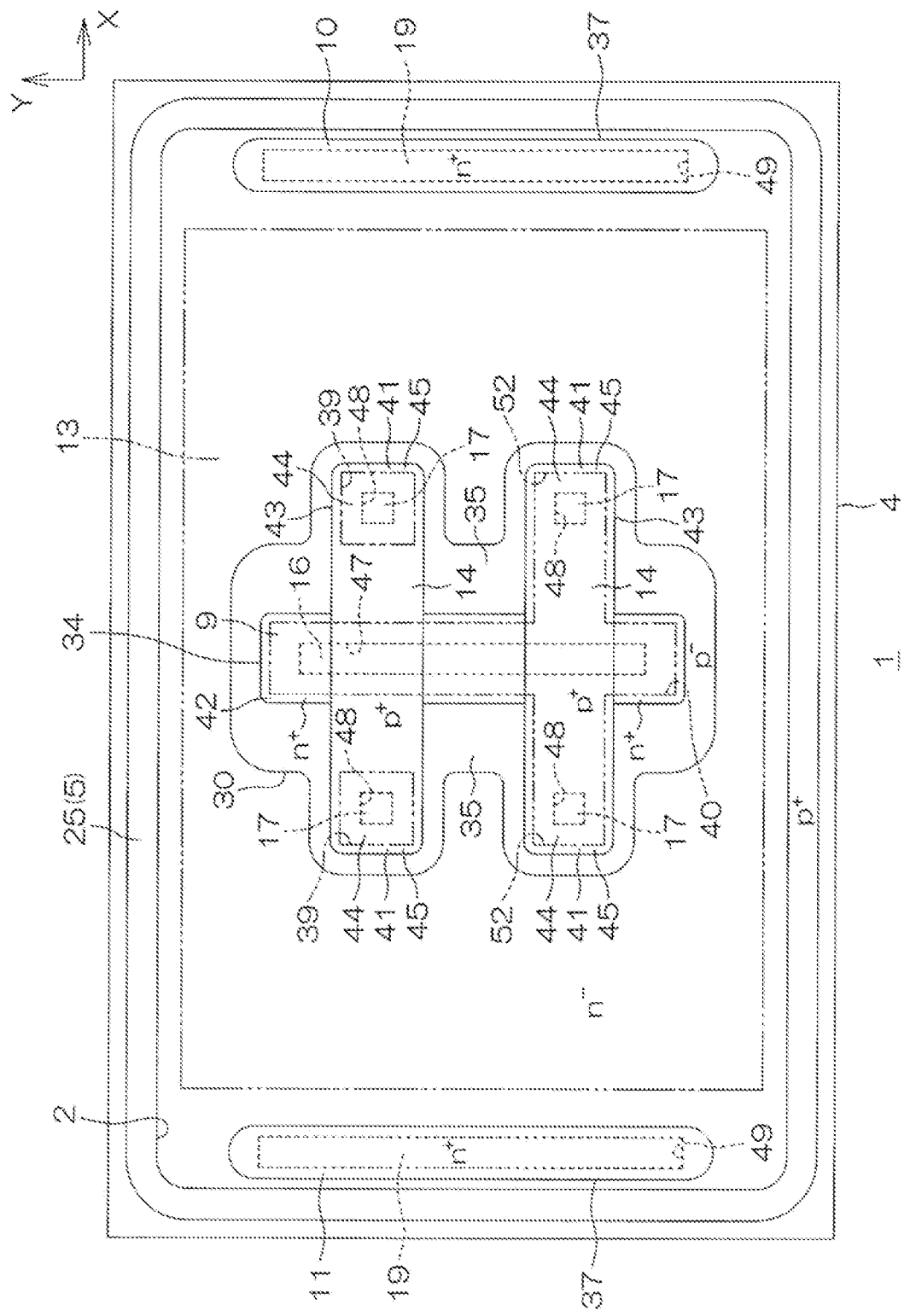
FIG. 13 is a view showing a modification of the semiconductor device.

Although the embodiments of the present disclosure have been described above, the present disclosure can also be implemented in other embodiments. For example, the first openings 39 and the concave portions 52 of the gate electrode 13 may coexist in the semiconductor device 1. In this case, for example, as shown in FIG. 13, the first openings 39 and the concave portions 52 of the gate electrode 13 may be formed at intervals in the second direction Y, and in line with that, a plurality of body contact regions 14 may be formed. Further, although not shown, the first openings 39 may be formed on the side of the first drain region 10 and the concave portions 52 may be formed on the side of the second drain region 11 with respect to the source region 9.

Figure 14:
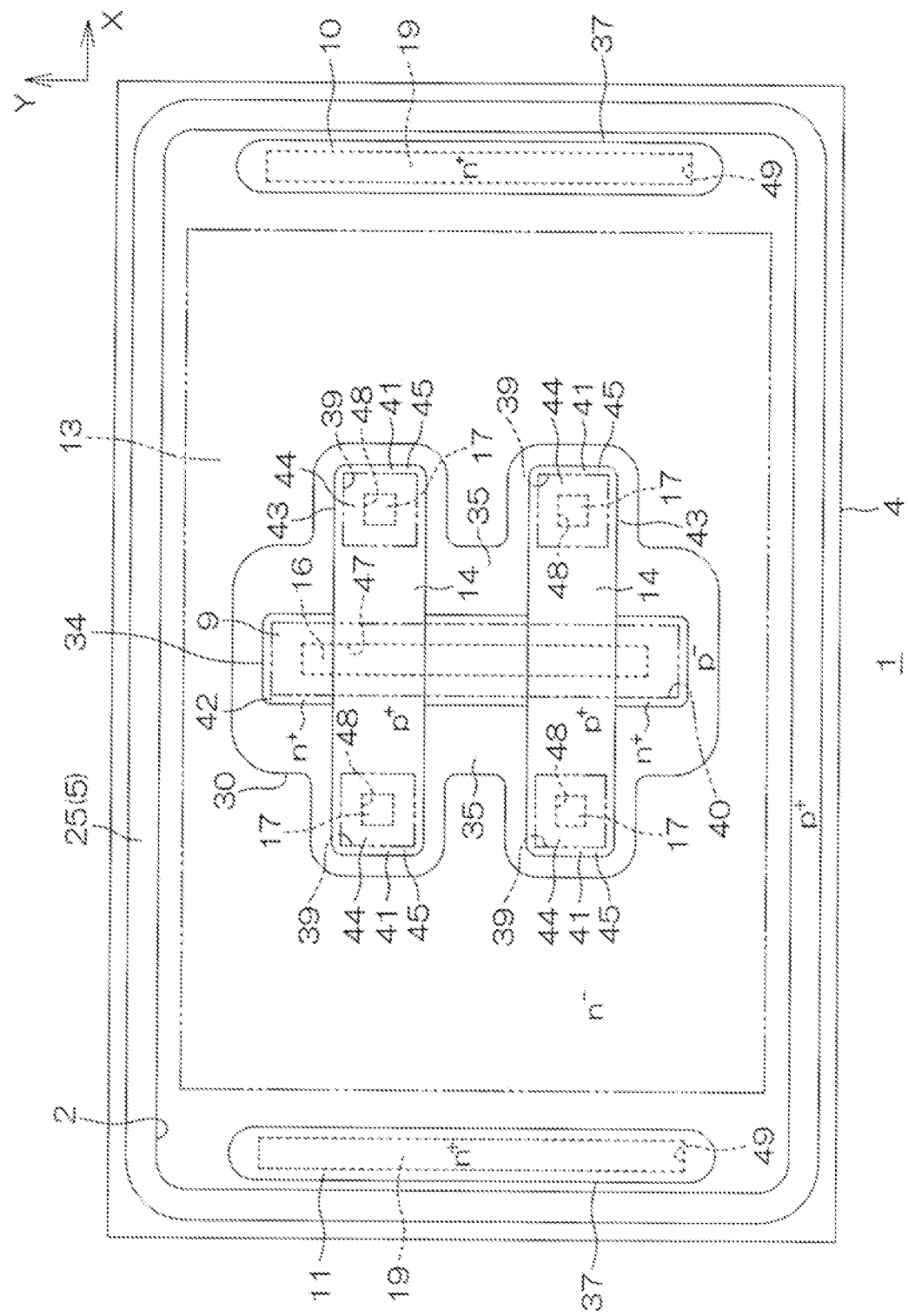
FIG. 14 is a view showing a modification of the semiconductor device.

Further, as shown in FIG. 14, a plurality of first openings 39 of the gate electrode 13 may be formed at intervals in the second direction Y, and in line with that, a plurality of body contact regions 14 may be formed.

Figure 15:
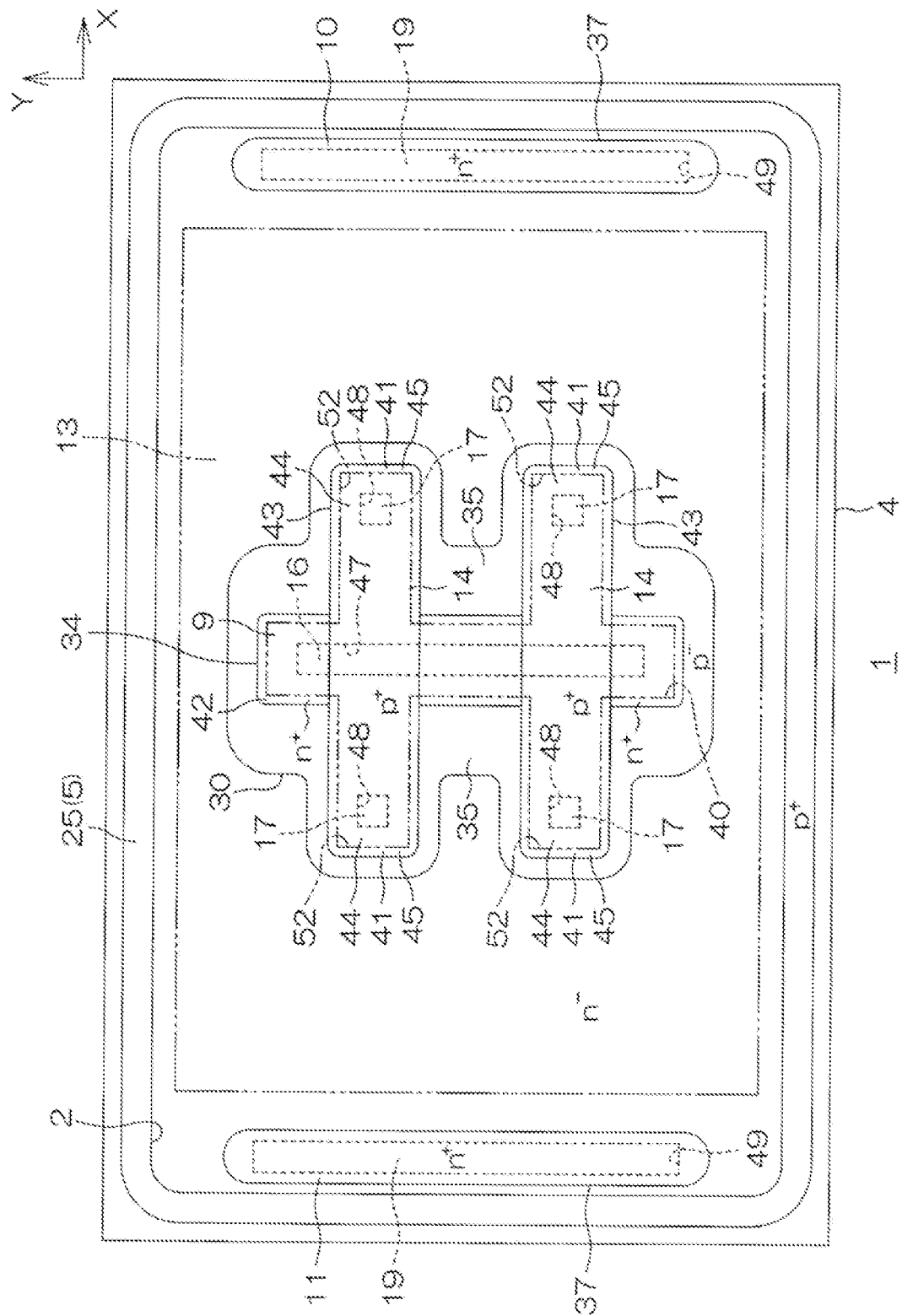
FIG. 15 is a view showing a modification of the semiconductor device.

In addition, as shown in FIG. 15, a plurality of concave portions 52 of the gate electrode 13 may be formed at intervals in the second direction Y, and in line with that, a plurality of body contact regions 14 may be formed.

Furthermore, as shown in FIG. 16, the source region 9 and the body contact region 14 may not be in contact with each other but may be separated from each other. In this case, a portion of the body region 8 may be exposed between the source region 9 and the body contact region 14 and may be connected to the source contact 16. Further, in the above-described embodiments, a configuration in which the conductive type of each semiconductor portion is inverted may be adopted. That is, a semiconductor device 1 in which p-type portions are n-type and n-type portions are p-type may be adopted.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
   a first conductive type semiconductor layer having an element main surface;
   a second conductive type body region formed on the element main surface of the semiconductor layer;
   a first conductive type source region formed in the body region and separated inward from an outer edge of the body region;
   at least one first conductive type drain region formed on the element main surface of the semiconductor layer and separated from the body region in a first direction; and
   a gate electrode facing a channel region between the source region and the outer edge of the body region, the gate electrode including a first edge portion adjacent to the source region, and at least one first opening formed in a portion separated from the first edge portion toward the at least one drain region in the first direction or at least one concave portion in which the first edge portion is selectively formed to be recessed toward the at least one drain region in the first direction,
   wherein the body region selectively has a portion exposed to the at least one first opening or the at least one concave portion of the gate electrode,
   wherein the semiconductor device further includes a second conductive type body contact region formed in the portion of the body region exposed to the at least one first opening or the at least one concave portion and having an impurity concentration higher than an impurity concentration of the body region, and wherein the source region is divided by the body contact region in a second direction intersecting the first direction.

2. The semiconductor device of claim 1, wherein the body region includes a first portion having a first width, and a second portion having a second width larger than the first width, the second portion selectively protruding from the first portion in the first direction and being exposed to the at least one first opening or the at least one concave portion of the gate electrode, and wherein the body contact region is formed in the second portion of the body region.

3. The semiconductor device of claim 1, wherein the body contact region extends toward the first edge portion of the gate electrode.

4. The semiconductor device of claim 3, wherein the first edge portion of the gate electrode includes an edge portion of a second opening that exposes the source region and the body contact region in common.

5. The semiconductor device of claim 1, wherein the first edge portion of the gate electrode includes an edge portion of a second opening that exposes the source region, wherein the at least one drain region includes a first drain region and a second drain region facing each other with the source region interposed between the first drain region and the second drain region in the first direction, and wherein the at least one first opening of the gate electrode includes two first openings that are formed on a side of the first drain region and a side of the second drain region, respectively, with respect to the source region.

6. The semiconductor device of claim 5, wherein the body contact region is formed in a line shape from the at least one first opening on the side of the first drain region to the at least one first opening on the side of the second drain region.

7. The semiconductor device of claim 6, wherein the body contact region has a portion, which is selectively shallow in depth from the element main surface, between the at least one first opening and the second opening.

8. The semiconductor device of claim 5, wherein a width of the at least one first opening is 0.4 μm to 1.0 μm.

9. The semiconductor device of claim 5, wherein the at least one first opening is separated from the second opening by 0.4 μm to 1.0 μm.

10. The semiconductor device of claim 1, wherein the at least one drain region includes a first drain region and a second drain region facing each other with the source region interposed between the first drain region and the second drain region in the first direction, and wherein the at least one concave portion of the gate electrode includes two concave portions that are formed toward a side of the first drain region and a side of the second drain region, respectively.

11. The semiconductor device of claim 10, wherein the body contact region is formed in a line shape from the at least one concave portion on the side of the first drain region toward the at least one concave portion on the side of the second drain region.

12. The semiconductor device of claim 10, wherein a depression amount of the at least one concave portion is 0.4 μm to 1.0 μm.

13. The semiconductor device of claim 1, further comprising:

an insulating layer formed on the semiconductor layer;

a source contact that penetrates the insulating layer and is connected to the source region;

at least one body contact that penetrates the insulating layer and is connected to the body contact region via the at least one first opening or the at least one concave portion; and a source wiring formed on the insulating layer and connected in common to the source contact and the at least one body contact.

14. The semiconductor device of claim 1, wherein the impurity concentration of the body region is $1\times10^{17}$ cm$^{-3}$ to $1\times10^{18}$ cm$^{-3}$, and the impurity concentration of the body contact region is $1\times10^{19}$ cm$^{-3}$ to $1\times10^{20}$ cm$^{-3}$.

15. The semiconductor device of claim 1, wherein the semiconductor layer includes a first element region including the body region, the source region, and the at least one drain region, and a second element region formed independently of the first element region, and wherein the semiconductor device further includes an integrated circuit device in which the first element region and the second element region are integrated in the common semiconductor layer.

* * * * *